United States Patent
Rhodes et al.

(10) Patent No.: US 12,074,150 B2
(45) Date of Patent: Aug. 27, 2024

(54) MODULE CONFIGURATIONS FOR INTEGRATED III-NITRIDE DEVICES

(71) Applicant: Transphorm Technology, Inc., Goleta, CA (US)

(72) Inventors: David Michael Rhodes, Santa Barbara, CA (US); Yifeng Wu, Goleta, CA (US); Sung Hae Yea, La Canada, CA (US); Primit Parikh, Goleta, CA (US)

(73) Assignee: Transphorm Technology, Inc., Goleta, CA (US)

( * ) Notice: Subject to any disclaimer, the term of this patent is extended or adjusted under 35 U.S.C. 154(b) by 0 days.

(21) Appl. No.: 18/325,829

(22) Filed: May 30, 2023

(65) Prior Publication Data

US 2023/0307429 A1 Sep. 28, 2023

Related U.S. Application Data

(63) Continuation of application No. 17/308,366, filed on May 5, 2021, now Pat. No. 11,749,656.

(Continued)

(51) Int. Cl.
*H01L 25/00* (2006.01)
*H01L 23/14* (2006.01)
(Continued)

(52) U.S. Cl.
CPC ............ *H01L 25/16* (2013.01); *H01L 23/142* (2013.01); *H01L 23/3107* (2013.01);
(Continued)

(58) Field of Classification Search
CPC . H01L 23/3735; H01L 23/3107; H01L 25/16; H03K 17/68; H03K 17/6871
See application file for complete search history.

(56) References Cited

U.S. PATENT DOCUMENTS 7,795,642 B2 9/2010 Suh et al.
7,851,825 B2 12/2010 Suh et al.
(Continued)

OTHER PUBLICATIONS

Authorized officer Kari Rodriquez, International Search Report and Written Opinion in PCT/US2021/032710, mailed Oct. 5, 2021, 16 pages.

(Continued)

*Primary Examiner* — Hoa B Trinh
(74) *Attorney, Agent, or Firm* — Fish & Richardson P.C.

(57) ABSTRACT

An electronic module for a half-bridge circuit includes a base substrate with an insulating layer between a first metal layer and a second metal layer. A trench formed through the first metal layer electrically isolates first, second, and third portions of the first metal layer from one another. A high-side switch includes an enhancement-mode transistor and a depletion-mode transistor. The depletion-mode transistor includes a III-N material structure on an electrically conductive substrate. A drain electrode of the depletion-mode transistor is connected to the first portion, a source electrode of the enhancement-mode transistor is connected to the second portion, a drain electrode of the enhancement-mode transistor is connected to a source electrode of the depletion-mode transistor, a gate electrode of the depletion-mode transistor is connected to the electrically conductive substrate, and the electrically conductive substrate is connected to the second portion.

23 Claims, 22 Drawing Sheets

Related U.S. Application Data

(60) Provisional application No. 63/039,853, filed on Jun. 16, 2020.

(51) Int. Cl.
| | |
|---|---|
| H01L 23/31 | (2006.01) |
| H01L 23/373 | (2006.01) |
| H01L 25/16 | (2023.01) |
| H01L 27/088 | (2006.01) |
| H03K 17/687 | (2006.01) |

(52) U.S. Cl.
 CPC ...... *H01L 23/3735* (2013.01); *H01L 27/0883* (2013.01); *H03K 17/6871* (2013.01); *H03K 2217/0063* (2013.01); *H03K 2217/0072* (2013.01)

(56) References Cited

U.S. PATENT DOCUMENTS

| | | |
|---|---|---|
| 7,875,907 B2 | 1/2011 | Honea et al. |
| 7,884,394 B2 | 2/2011 | Wu et al. |
| 7,898,004 B2 | 3/2011 | Wu et al. |
| 7,915,643 B2 | 3/2011 | Suh et al. |
| 7,939,391 B2 | 5/2011 | Suh et al. |
| 7,965,126 B2 | 6/2011 | Honea et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,431,965 B2 | 4/2013 | Takemae |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,530,996 B2 | 9/2013 | Shono |
| 8,531,232 B2 | 9/2013 | Honea et al. |
| 8,536,622 B2 | 9/2013 | Takemae et al. |
| 8,541,815 B2 | 9/2013 | Takemae et al. |
| 8,541,818 B2 | 9/2013 | Wu et al. |
| 8,569,124 B2 | 10/2013 | Akiyama et al. |
| 8,581,300 B2 | 11/2013 | Yamada |
| 8,592,974 B2 | 11/2013 | Wu |
| 8,598,937 B2 | 12/2013 | Lal et al. |
| 8,603,880 B2 | 12/2013 | Yamada |
| 8,624,662 B2 | 1/2014 | Parikh et al. |
| 8,633,517 B2 | 1/2014 | Kamada |
| 8,633,518 B2 | 1/2014 | Suh et al. |
| 8,643,062 B2 | 2/2014 | Parikh et al. |
| 8,648,643 B2 | 2/2014 | Wu |
| 8,664,927 B2 | 3/2014 | Shono |
| 8,675,326 B2 | 3/2014 | Shono |
| 8,692,294 B2 | 4/2014 | Chu et al. |
| 8,716,141 B2 | 5/2014 | Dora et al. |
| 8,742,459 B2 | 6/2014 | Mishra et al. |
| 8,742,460 B2 | 6/2014 | Mishra et al. |
| 8,766,711 B2 | 7/2014 | Takemae |
| 8,772,842 B2 | 7/2014 | Dora |
| 8,773,176 B2 | 7/2014 | Miyazaki et al. |
| 8,786,327 B2 | 7/2014 | Honea et al. |
| 8,803,246 B2 | 8/2014 | Wu et al. |
| 8,816,497 B2 | 8/2014 | Wu |
| 8,816,751 B2 | 8/2014 | Honea et al. |
| 8,836,301 B2 | 9/2014 | Shono |
| 8,836,308 B2 | 9/2014 | Shono |
| 8,836,380 B2 | 9/2014 | Takemae |
| 8,841,702 B2 | 9/2014 | Mishra et al. |
| 8,847,283 B2 | 9/2014 | Kamada et al. |
| 8,860,495 B2 | 10/2014 | Lal et al. |
| 8,878,248 B2 | 11/2014 | Ishiguro et al. |
| 8,878,571 B2 | 11/2014 | Takemae |
| 8,883,581 B2 | 11/2014 | Ohki |
| 8,890,206 B2 | 11/2014 | Yamada |
| 8,890,314 B2 | 11/2014 | Wu |
| 8,895,421 B2 | 11/2014 | Parikh et al. |
| 8,895,423 B2 | 11/2014 | Dora |
| 8,901,604 B2 | 12/2014 | Mishra et al. |
| 8,912,839 B2 | 12/2014 | Honea et al. |
| 8,933,489 B2 | 1/2015 | Kikkawa |
| 8,952,750 B2 | 2/2015 | Wu |
| 8,957,453 B2 | 2/2015 | Yamada et al. |
| 8,962,409 B2 | 2/2015 | Tomabechi |
| 9,006,787 B2 | 4/2015 | Yamada |
| 9,035,356 B2 | 5/2015 | Yamada |
| 9,041,435 B2 | 5/2015 | Honea et al. |
| 9,041,465 B2 | 5/2015 | Bouisse |
| 9,059,076 B2 | 6/2015 | Wu et al. |
| 9,059,136 B2 | 6/2015 | Kamada et al. |
| 9,087,718 B2 | 7/2015 | Lal |
| 9,093,366 B2 | 7/2015 | Mishra et al. |
| 9,099,351 B2 | 8/2015 | Nishimori et al. |
| 9,099,545 B2 | 8/2015 | Akiyama et al. |
| 9,111,961 B2 | 8/2015 | Chu et al. |
| 9,136,107 B2 | 9/2015 | Katani et al. |
| 9,142,638 B2 | 9/2015 | Yamada |
| 9,142,658 B2 | 9/2015 | Kikkawa et al. |
| 9,147,760 B2 | 9/2015 | Mishra et al. |
| 9,165,766 B2 | 10/2015 | Keller et al. |
| 9,171,730 B2 | 10/2015 | Chowdhury et al. |
| 9,171,836 B2 | 10/2015 | Lal et al. |
| 9,171,910 B2 | 10/2015 | Wu et al. |
| 9,184,275 B2 | 11/2015 | Mishra et al. |
| 9,190,295 B2 | 11/2015 | Wu |
| 9,196,716 B2 | 11/2015 | Mishra et al. |
| 9,209,176 B2 | 12/2015 | Wu et al. |
| 9,224,671 B2 | 12/2015 | Parikh et al. |
| 9,224,721 B2 | 12/2015 | Wu |
| 9,224,805 B2 | 12/2015 | Mishra et al. |
| 9,231,075 B2 | 1/2016 | Yamada |
| 9,244,848 B2 | 1/2016 | Boyd et al. |
| 9,245,992 B2 | 1/2016 | Keller et al. |
| 9,245,993 B2 | 1/2016 | Keller et al. |
| 9,257,547 B2 | 2/2016 | Fichtenbaum et al. |
| 9,293,458 B2 | 3/2016 | Parikh et al. |
| 9,293,561 B2 | 3/2016 | Mishra et al. |
| 9,299,822 B2 | 3/2016 | Kikkawa |
| 9,318,593 B2 | 4/2016 | Wu et al. |
| 9,343,560 B2 | 5/2016 | Suh et al. |
| 9,349,805 B2 | 5/2016 | Ito et al. |
| 9,362,903 B2 | 6/2016 | Wu et al. |
| 9,373,699 B2 | 6/2016 | Chu et al. |
| 9,401,341 B2 | 7/2016 | Wu |
| 9,425,268 B2 | 8/2016 | Minoura et al. |
| 9,437,707 B2 | 9/2016 | Mishra et al. |
| 9,437,708 B2 | 9/2016 | Mishra et al. |
| 9,443,849 B2 | 9/2016 | Wu et al. |
| 9,443,938 B2 | 9/2016 | Mishra et al. |
| 9,490,324 B2 | 11/2016 | Mishra et al. |
| 9,496,137 B2 | 11/2016 | Chu et al. |
| 9,520,491 B2 | 12/2016 | Chowdhury et al. |
| 9,536,966 B2 | 1/2017 | Ogino |
| 9,536,967 B2 | 1/2017 | Kikkawa et al. |
| 9,537,425 B2 | 1/2017 | Honea |
| 9,543,940 B2 | 1/2017 | Wang et al. |
| 9,590,060 B2 | 3/2017 | Lal |
| 9,590,494 B1 | 3/2017 | Zhou et al. |
| 9,620,616 B2 | 4/2017 | Yamada et al. |
| 9,634,100 B2 | 4/2017 | Mishra et al. |
| 9,640,648 B2 | 5/2017 | Kikkawa |
| 9,660,640 B2 | 5/2017 | Wang et al. |
| 9,685,323 B2 | 6/2017 | Keller et al. |
| 9,685,338 B2 | 6/2017 | Minoura et al. |
| 9,690,314 B2 | 6/2017 | Honea et al. |
| 9,741,702 B2 | 8/2017 | Wu |
| 9,818,686 B2 | 11/2017 | Wu et al. |
| 9,818,840 B2 | 11/2017 | Kikkawa |
| 9,831,315 B2 | 11/2017 | Chu et al. |
| 9,842,922 B2 | 12/2017 | Mishra et al. |
| 9,865,719 B2 | 1/2018 | Keller et al. |
| 9,899,998 B2 | 2/2018 | Honea et al. |
| 9,935,190 B2 | 4/2018 | Wu et al. |

(56) References Cited

U.S. PATENT DOCUMENTS

| | | | |
|---|---|---|---|
| 9,941,399 | B2 | 4/2018 | Mishra et al. |
| 9,991,884 | B2 | 6/2018 | Wang et al. |
| 10,043,896 | B2 | 8/2018 | Mishra et al. |
| 10,043,898 | B2 | 8/2018 | Lal |
| 10,063,138 | B1 | 8/2018 | Zhou et al. |
| 2007/0228416 | A1* | 10/2007 | Chen .................. H01L 27/0605 257/192 |
| 2011/0101466 | A1 | 5/2011 | Wu |
| 2014/0070627 | A1 | 3/2014 | Briere et al. |
| 2014/0103989 | A1 | 4/2014 | Wu |
| 2014/0138701 | A1 | 5/2014 | Huang et al. |
| 2014/0225162 | A1 | 8/2014 | Briere |
| 2014/0375242 | A1 | 12/2014 | Briere |
| 2015/0014698 | A1 | 1/2015 | Briere |
| 2015/0371982 | A1 | 12/2015 | Pan et al. |
| 2016/0079154 | A1 | 3/2016 | Wu et al. |
| 2017/0194237 | A1 | 7/2017 | Kinzer |
| 2019/0198615 | A1 | 6/2019 | Mishra et al. |
| 2019/0319471 | A1 | 10/2019 | Kinzer et al. |
| 2021/0391311 | A1 | 12/2021 | Rhodes et al. |

OTHER PUBLICATIONS

Barr et al., "High Voltage GaN Switch Reliability," WIPDA Conference, Atlanta, GA, Nov. 2018, 7 pages.

Chu et al., "1200-V Normally off GaN-on-Si Field-effect Transistors with Low Dynamic On-Resistance," IEEE Electron Device Letters, 2011, 32(5):632-634.

Coffie et al., "Unpassivated p-GaN/AlGaN/GaN HEMTs with 7.1 W/mm at 10 GhZ," Electronic Letters, 2003, 39(19):1419-1420.

Coffie, "Characterizing and Suppressing DC-to-RF Dispersion in AlGaN/GaN High Electron Mobility Transistors," 2003, PhD Thesis, University of California, Santa Barbara, 169 pages.

Dora et al., "High Breakdown Voltage Achieved on AlGaN/GaN HEMTs with Integrated Slant Field Plates," IEEE Electron Device Letters, 2006, 27(9):713-715.

Dora et al., "ZrO2 Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Huang and Cuadra, "Preventing GaN Device VHF Oscillation," APEC 2017 Industry Session, Mar. 2017, 25 pages.

Keller et al., "GaN—GaN Junctions with Ultrathin AlN Interlayers: Expanding Heterojunction Design," Applied Physics Letters, 2002, 80(23):4387-4389.

Mishra et al., "AlGaN/GaN HEMTs—An Overview of Device Operation and Applications," Proceedings of the IEEE, 2002, 90(6):1022-1031.

Parikh et al., "650 Volt GaN Commercialization Reaches Automotive Standards," ECS Transactions, 2017, 80(7):17-28.

Parikh et al., "Commercialization of High 600V GaN-on-Silicon Power HEMTs and Diodes," 2013 IEEE, 5 pages.

Parikh, "Driving the Adoption of High-voltage Gallium Nitride Filed-effect Transistors," IEEE Power Electronics Magazine, Sep. 2017, 3 pages.

Shen, "Advanced Polarization-based Design of AlGaN/GaN HEMTs," Jun. 2004, PhD Thesis, University of California, Santa Barbara, 192 pages.

Smith and Barr, "Reliability Lifecycle of GaN Power Devices," Transphorm Inc., Mar. 2017, 8 pages.

Suh et al. "High-Breakdown Enhancement-mode AlGaN/GaN HEMTs with Integrated Slant Field-Plate," Electron Devices Meeting, 2006, IEDM '06 International, 3 pages.

Wang et al., "Investigation of Driver Circuits for GaN HEMTs in Leaded Packages," Workshop on Wide Bandgap Power Devices and Applications (WiPDA), 2014 IEEE, pp. 81-87.

Wang et al., "Paralleling GaN HEMTs for Diode-free Bridge Power Converters," 2015 IEEE Applied Power Electronics Conference and Exposition (APEC), Charlotte, NC, 2015, pp. 752-758.

Wang, et al., "Design and Implementation of a High-efficiency Three-level Inverter Using GaN HEMTs," PCIM Europe 2015, May 19-21, 2015, Nuremberg, Germany, 7 pages.

Wu et al., "A 97.8% Efficient GaN HEMT Boost Converter with 300-W Output Power at 1 MHZ," Electronic Device Letters, 2008, IEEE, 29(8):824-826.

Wu et al., "Advances in Reliability and Operation Space of High-voltage GaN Power Devices on Si Substrates," (2014) IEEE, 3 pages.

Wu et al., "High-frequency, GaN Diode-free Motor Drive Inverter with Pure Sine Wave Output," PCIM Europe 2012, Conference Digest, pp. 40-43.

Wu et al., "kV-Class GaN-on-Si HEMTs Enabling 99% Efficiency Converter at 800 V and 100 kHz," IEEE Transactions on Power Electronics. 2014 29(6):2634-2637.

Wu et al., "Total GaN Solution to Electrical Power Conversion," the 69th IEEE Device Research Conference, Conference Digest, Jun. 20-22, 2011, pp. 217-218.

Wu, "AlGaN/GaN Microwave Power High-Mobility Transistors," PhD Thesis, University of California, Santa Barbara, Jul. 1997, 134 pages.

Wu, "Paralleling High-speed GaN Power HEMTs for Quadrupled Power Output," Applied Power Electronics Conference and Exposition (APEC), 2013, pp. 211-214.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three-phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang et al., "Gate Drive Design Considerations for High Voltage Cascode GaN HEMT," Applied Power Electronics Conference and Exposition (APEC), Mar. 2014, pp. 1484-1489.

Zhang et al., "Impact of Interleaving on AC Passive Components of Paralleled Three-phase Voltage-source Converters," IEEE Transactions on Industry Applications, May/Jun. 2010, 46(3):1042-1054.

Zhang, "High Voltage GaN HEMTs with Low On-resistance for Switching Applications," PhD Thesis, University of California, Santa Barbara, Sep. 2002, 166 pages.

Zhou and Wu, "99% Efficiency True-bridgeless Totem-pole PFC Based on GaN HEMTs," PCIM Europe May 14-16, 2013, pp. 1017-1022.

Zhou et al., "High-efficiency True Bridgeless Totem Pole PFC Based on GaN HEMTs: Design Challenges and Cost-effective Solution," PCIM Europe 2015, pp. 1482-1489.

Zuk and Campeau, "How to Design with GaN in 1 Hour!," APEC 2017 Exhibitor Session, Mar. 2017, 24 pages.

* cited by examiner

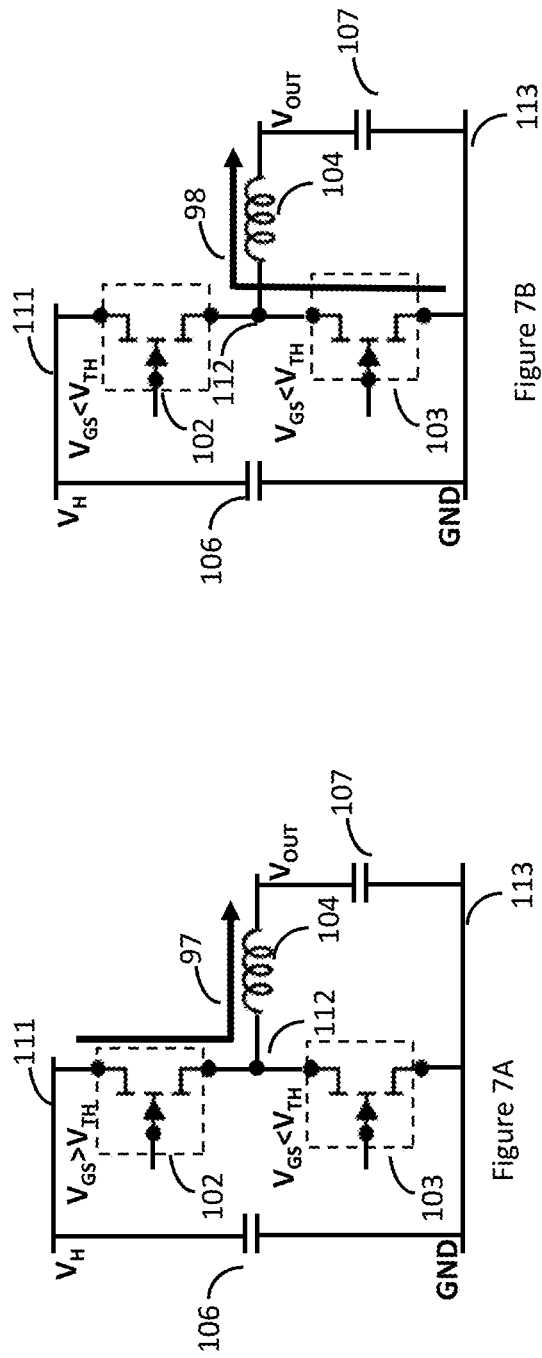
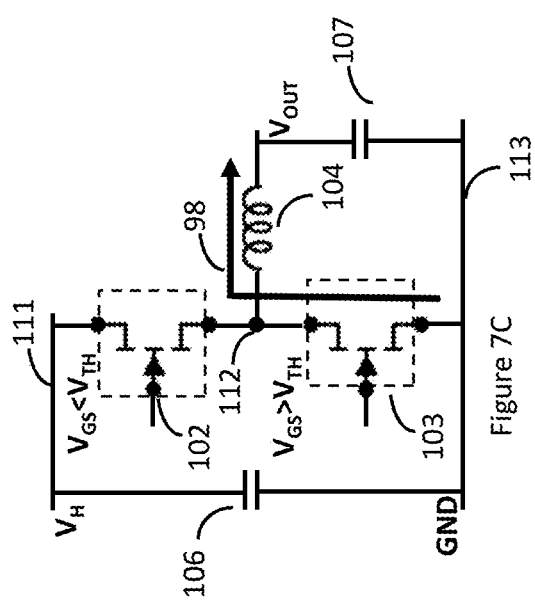
Figure 7A
Figure 7B
Figure 7C

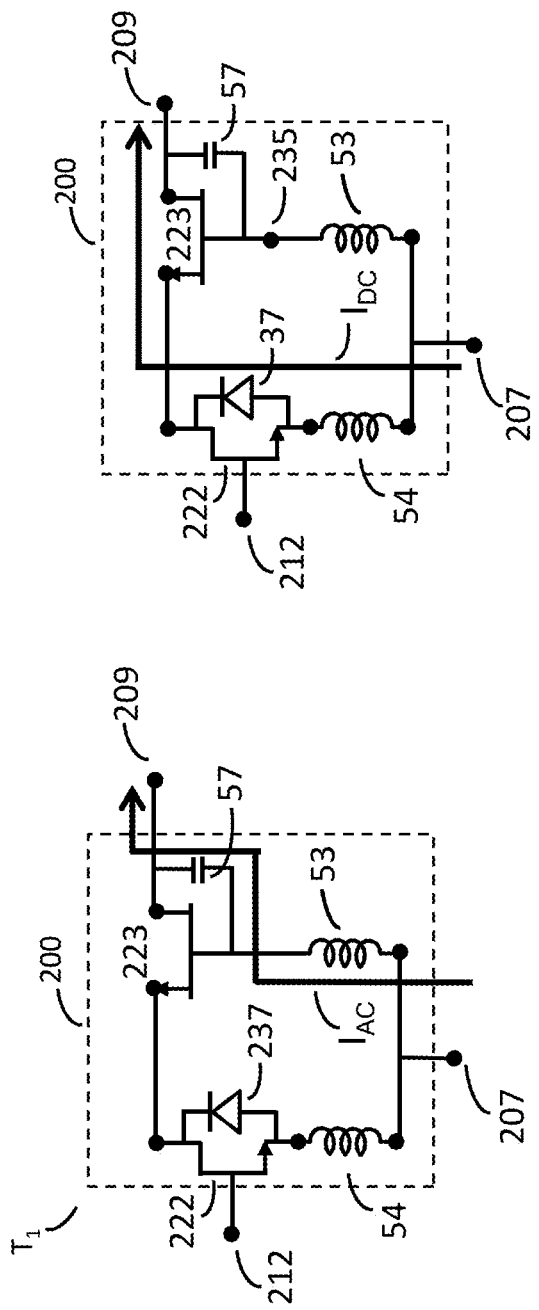

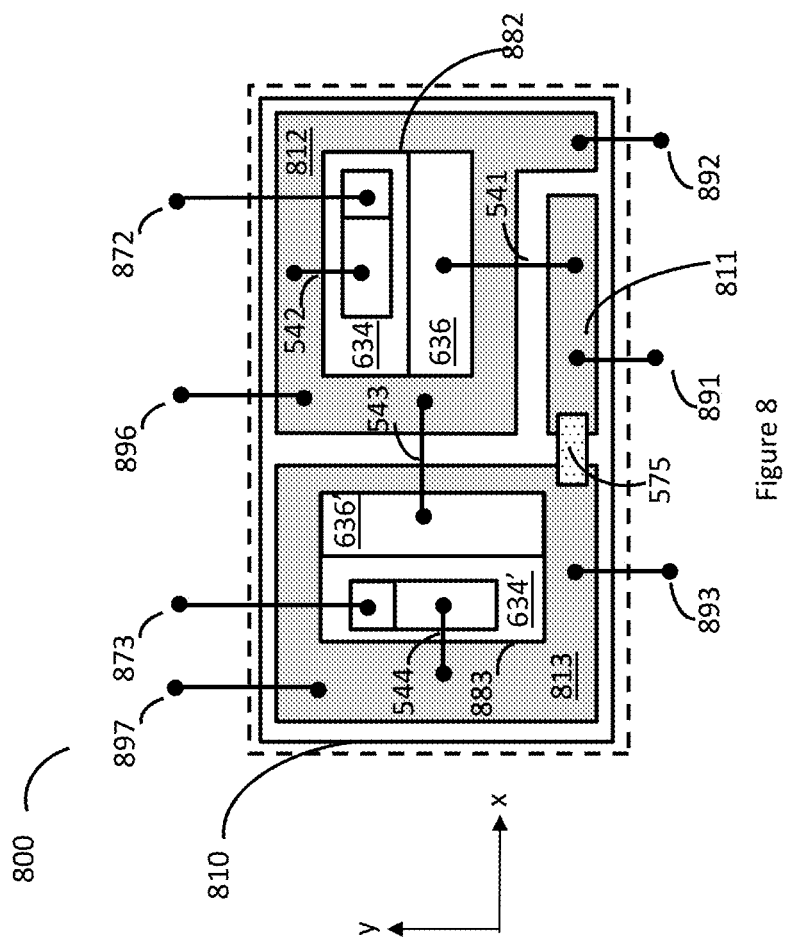

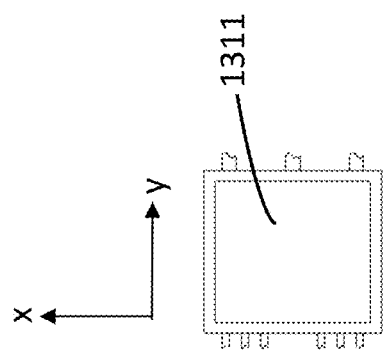
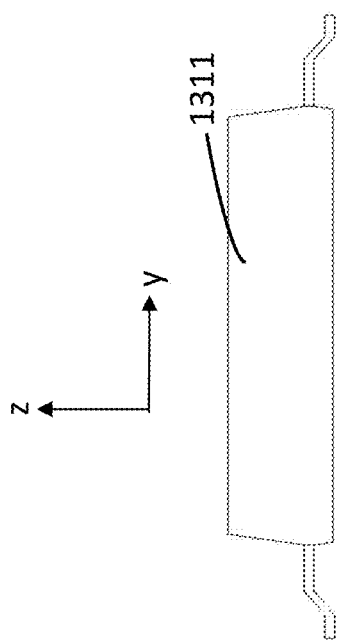

MODULE CONFIGURATIONS FOR INTEGRATED III-NITRIDE DEVICES

CROSS-REFERENCE TO RELATED APPLICATIONS

This application is a continuation of U.S. application Ser. No. 17/308,366, filed May 5, 2021, which claims priority to U.S. Application Ser. No. 63/039,853, filed on Jun. 16, 2020, the disclosure of which is incorporated by reference.

TECHNICAL FIELD

The disclosed technologies relate to semiconductor electronic modules designed to achieve increased performance and reliability.

BACKGROUND

Currently, typical power semiconductor devices, including devices such as transistors, diodes, power MOSFETs and insulated gate bipolar transistors (IGBTs), are fabricated with silicon (Si) semiconductor material. More recently, wide-bandgap materials (SiC, III-N, III-O, diamond) have been considered for power devices due to their superior properties. III-Nitride or III-N semiconductor devices, such as gallium nitride (GaN) devices, are now emerging as attractive candidates to carry large currents, support high voltages, and provide very low on-resistance with fast switching times.

FIG. 1A shows a half-bridge circuit schematic 100 which includes a high-side switching transistor 102 and a low-side switching transistor 103. The half-bridge circuit has a high voltage node 111 and a low voltage or ground node 113. An output node 112 of the half bridge, which is between the source of the high-side transistor 102 and the drain of the low-side transistor 103, is connected to a load motor (inductive component 104). In order to ensure proper operation of the circuit in FIG. 1A, the DC high voltage node 111 must be maintained as an AC ground. That is, node 111 can be capacitively coupled to DC ground 113 by connecting one terminal of a capacitor 106 to the high voltage node 111 and the other terminal of the capacitor to ground 113. Hence, when either of transistors 102 or 103 are switched on or off, the capacitor 106 can charge or discharge as needed to provide the current necessary to maintain a substantially constant voltage at the high and low voltage sides of the circuit.

A circuit schematic of a 3-phase full bridge circuit 120 configured to drive a 3-phase motor is shown in FIG. 1B. Each of the three half bridges 122, 124, and 126 in circuit 120 includes two transistors (141-146) such as the half bridge of FIG. 1A. Each of the three half bridges has an output node 137, 138, or 139. Each of the transistors in this circuit is able to block voltage in a first direction and is capable of conducting current in the first direction or optionally in both directions.

One type of transistor which is showing promising benefits when used in the circuits of FIGS. 1A and 1B is the III-N high electron mobility transistor (HEMT), which can be used as the transistor 102 and/or transistor 103 in the half bridge of FIG. 1A, or as any of the transistors in the bridge circuit of FIG. 1B. Most conventional III-N HEMTs and related transistor devices are normally on (i.e., have a negative threshold voltage), which means that they conduct current at zero gate voltage. These devices with negative threshold voltages are known as depletion-mode (D-mode) devices. It is preferable in power electronics to have normally off devices (i.e., devices with positive threshold voltages), that are in the off state when zero volts is applied to the gate relative to the source, in order to prevent accidental turn-on of the device, which can lead to damage of the device or to other circuit components. Normally off devices are commonly referred to as enhancement-mode (E-mode) devices.

Reliable fabrication and operation of high-voltage III-N E-mode transistors has thus far proven to be very difficult. One alternative to a single high-voltage E-mode transistor is to combine a high-voltage D-mode III-N transistor with a low-voltage silicon E-mode FET in a cascode configuration. As seen in FIG. 2, the cascode configuration 200 includes a high-voltage D-mode transistor 223 and a low-voltage E-mode transistor 222 encased in a package 205. The source electrode 234 of transistor 223 is connected to the drain electrode 213 of transistor 222. The gate electrode 235 of transistor 223 and the source electrode 211 of transistor 222 are connected to one another and to source lead 207 of the package 205. The gate electrode 212 of transistor 222 is connected to the gate lead 208 of the package 205. The drain electrode 236 of transistor 223 is connected to the drain lead 209 of the package 205. The E-mode FET transistor 222 includes an intrinsic body diode 237 which is formed between the source 211 and drain 213. Devices that are configured in the cascode configurate 200 of FIG. 2 can be operated in the same way as a single high-voltage E-mode transistor, with leads 207, 208, and 209 functioning as the respective source, gate, and drain of the device, and in many cases achieve the same or similar output characteristics as a single high-voltage E-mode transistor.

A common method of operation of the circuits of FIGS. 1A and 1B involves hard-switching of the switches (i.e., the transistors or cascode switches). A hard-switching circuit configuration is one in which the switches have high currents (e.g., greater than 10 A) passing through them as soon as they are switched ON and have high voltages across them as soon as they are switched OFF. Switches that are switched under these conditions are said to be "hard-switched". Alternative circuit configurations make use of additional passive and/or active components, or alternatively signal timing techniques, to allow the switches to be "soft-switched". A soft-switching circuit configuration is one in which the switches are switched ON during zero-current (or near zero-current) conditions and switched OFF during zero-voltage (or near zero-voltage) conditions. Soft-switching methods and configurations have been developed to address the high levels of electro-magnetic interference (EMI) and associated ringing observed in hard-switched circuits, especially in high current and/or high voltage applications. While soft-switching can in many cases alleviate these problems, the circuitry required for soft switching typically includes many additional components, resulting in increased overall cost and complexity. Soft-switching also typically requires that the circuits be configured to switch only at specific times when the zero-current or zero-voltage conditions are met, hence limiting the control signals that can be applied and in many cases reducing circuit performance. Hence, alternative configurations and methods are desirable for hard-switched power switching circuits in order to maintain sufficiently low levels of EMI as well as reducing circuit inductance and improving switching speed stability.

SUMMARY

Described herein are module configurations for integrated III-N devices, for which a low-voltage enhancement-mode device and a high-voltage depletion-mode III-N device are integrated into a single electronic component module to form half bridge and full bridge power switching circuits. The term device will be used in general for any transistor or switch or diode when there is no need to distinguish between them.

In a first aspect, an electronic module is described. The electronic module includes a base substrate comprising an insulating layer between a first metal layer and a second metal layer, the first metal layer including a first portion, a second portion, and a third portion, were a trench formed through the first metal layer electrically isolates the first, second, and third portions of the first metal layer from one another. The electronic module further includes a high-side switch comprising an enhancement-mode transistor and a depletion-mode transistor, where the depletion-mode transistor comprises a III-N material structure on an electrically conductive substrate. The electronic module further includes a low-side switch. A drain electrode of the depletion-mode transistor is electrically connected to the first portion of the first metal layer, a source electrode of the enhancement-mode transistor is electrically connected to the second portion of the first metal layer, a drain electrode of the enhancement-mode transistor is electrically connected to a source electrode of the depletion-mode transistor, a gate electrode of the depletion-mode transistor is electrically connected to the electrically conductive substrate, and the electrically conductive substrate is electrically connected to the second portion of the first metal layer.

In a second aspect, a half-bridge circuit is described. The half-bridge circuit comprises a high-side switch and a low-side switch each encased in a single electronic package, where the package comprises a high-voltage terminal, an output terminal, and a ground terminal. The high-side switch comprises a first enhancement-mode transistor and a first depletion-mode transistor arranged in a cascode configuration. The low-side switch comprises a second enhancement-mode transistor and a second depletion-mode transistor arranged in a cascode configuration. A drain electrode of the first III-N transistor is electrically connected to the high-voltage terminal, a conductive substrate of the first depletion-mode III-N transistor is electrically connected to the output terminal, a drain electrode of the second III-N transistor is electrically connected to the output terminal, and a conductive substrate of the second depletion-mode III-N transistor is electrically connected to the ground terminal.

In a third aspect, a half-bridge circuit is described. The half-bridge circuit comprises a high-side switch and a low-side switch each encased in a single electronic package. The high-side switch is connected to a high voltage node, the low-side switch is connected to a ground node and an inductor is connected to an output terminal of the package which is configured between the high-side switch and the low-side switch. The low-side switch comprises a low-voltage enhancement-mode transistor and a high-voltage III-N depletion-mode transistor arranged in a cascode configuration. The half-bridge circuit is configured such that in a first mode of operation, current flows through the high-side switch in a first direction and through the inductor while the high-side switch is biased ON and the low-side switch is biased OFF. In a second mode of operation current flows through the low-side switch in a second direction and through the inductor while the high-Oside switch is biased OFF and the low-side switch is biased OFF. In a third mode of operation current flows through the low-side switch in the second direction and through the inductor while the high-side switch is biased OFF and the low-side switch is biased ON, where during the second mode of operation, the low-side switch is configured to conduct a reverse DC current greater than 50 A, and where during the third mode of operation an increase in-on resistance of the III-N depletion-mode transistor relative to the first mode is less than 5%.

Each of the electronic modules and/or transistors described herein can include one or more of the following features. The high-side switch and the low-side switch can form a half-bridge circuit. The depletion-mode transistor can be configured to block at least 600V when the high-side switch is biased off and to conduct greater than 30 A while the high-side switch is biased on. The electronic module can include a capacitor, where a first terminal of the capacitor is electrically connected the first portion of the first metal layer, and a second terminal of the capacitor is electrically connected to the third portion of the first metal layer. The capacitor can be formed perpendicularly over the trench. The capacitor can be a hybrid capacitor comprising a resistive and capacitive component in series. The resistive component can be greater than 0.1 ohm and the capacitive component can be greater than 0.1 nF. The gate electrode the source electrode and the drain electrode can be on an opposite side of the III-N material structure form the electrically conductive substrate. The III-N material structure can include a via-hold formed through the substrate and the gate electrode of the depletion mode transistor is electrically connected to the substrate through the via-hole. The electronic module can include a package, where the substrate, the high-side switch and the low-side switch are encased within the package. The electronic module can include a gate driver incased within the package, where a first terminal of the gate driver is connected to the gate electrode of the high-side switch, and a second terminal of the gate driver is connected to the gate electrode of the low-side switch. The gate driver can be integrated with the E-mode transistors of the high-side and low-side switches. A second high-side witch can be connected in parallel to the high-side switch and a second low-side switch can be connected in parallel to the low-side switch. The second portion of the first metal layer is connected to an output node of the electronic module. The module is configured such that during operation, the first portion of the first metal layer is connected to a DC voltage supply and the third portion of the first metal layer is connected to a DC ground. A ferrite bead with a first terminal and a second terminal, where the first terminal of the ferrite bead is connected to the second portion of the first metal layer and the second terminal is connected to the output terminal. The first and/or second depletion-mode III-N transistors' substrates are silicon doped p-type substrates with a hole concentration greater than $1\times10^{19}$ hole/$cm^3$. During a second mode of operation, the reverse DC current flows through a parasitic body diode of the enhancement-mode transistor and through the a device channel of the III-N depletion-mode transistor. During a third mode of operation, the reverse DC current flows through a channel of the enhancement-mode transistor and through the a device channel of the III-N depletion-mode transistor.

As used herein, a "hybrid enhancement-mode electronic device or component", or simply a "hybrid device or component", is an electronic device or component formed of a depletion-mode transistor and an enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \le w \le 1$, $0 \le x \le 1$, $0 \le y \le 1$, and $0 \le z \le 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance ($R_{ON}$) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, or other suitable blocking voltage required by the application. For a bidirectional or four quadrant switch, the blocked voltage could be of any polarity less a certain maximum when the switch is OFF ($\pm V_{max}$ such as $\pm 300V$ or $\pm 600V$, $\pm 1200V$ and so on), and the current can be in either direction when the switch is ON.

As used herein, a "III-N device" is a device having a conductive channel formed in a III-N material. A III-N device can be designed to operate as a transistor or switch in which the state of the device is controlled by a gate terminal or as a two terminal device that blocks current flow in one direction and conducts in another direction without a gate terminal. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

In typical power switching applications in which high-voltage switching transistors are used, the transistor is during the majority of time in one of two states. In the first state, which is commonly referred to as the "ON state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "OFF state", the voltage at the gate electrode relative to the source electrode is lower than the transistor threshold voltage, and no substantial current, apart from off-state leakage current, flows through the transistor. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the transistor. In some applications, inductive elements in the circuit cause the voltage between the source and drain to be even higher than the circuit high voltage supply. Additionally, there are short times immediately after the gate has been switched on or off during which the transistor is in a transition mode between the two states described above. When the transistor is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

FIGS. 7A-7E are circuit schematics of different modes of operating a half bridge.
FIG. 8 is a plan view of an electronic module featuring a half bridge.
FIG. 13A and FIG. 13B show a side view and top view, respectively, of an encapsulated SMPD type package.

Like reference symbols in the various drawings indicate like elements.

DETAILED DESCRIPTION

Described herein are electronic modules and methods of operation thereof that are suitable for maintaining low levels of EMI, thereby allowing for higher circuit stability and improved performance. The design of the modules, coupled with the design of the switches used in the modules, can result in reduced inductances as well as other parasitics, thereby leading to the above stated improvements in performance. The electronic modules can also have a reduced size and can be easier to assemble than conventional modules, thereby allowing for lower production costs.

Figure 3A:
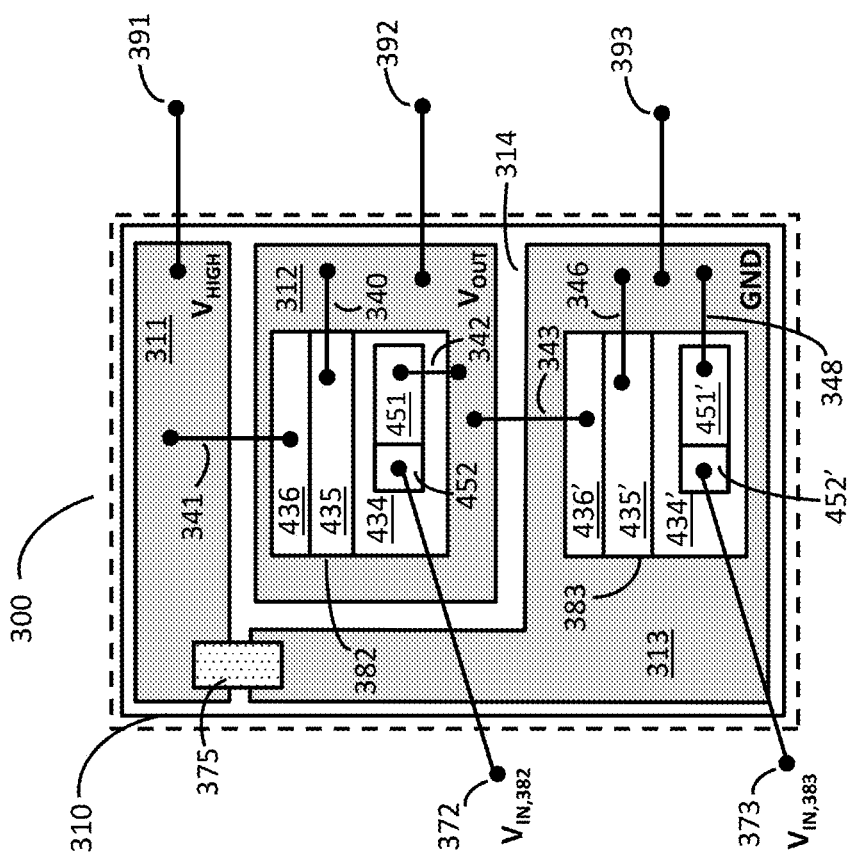
FIG. 3A is a plan view of an electronic module featuring a half bridge
Figure 3B:
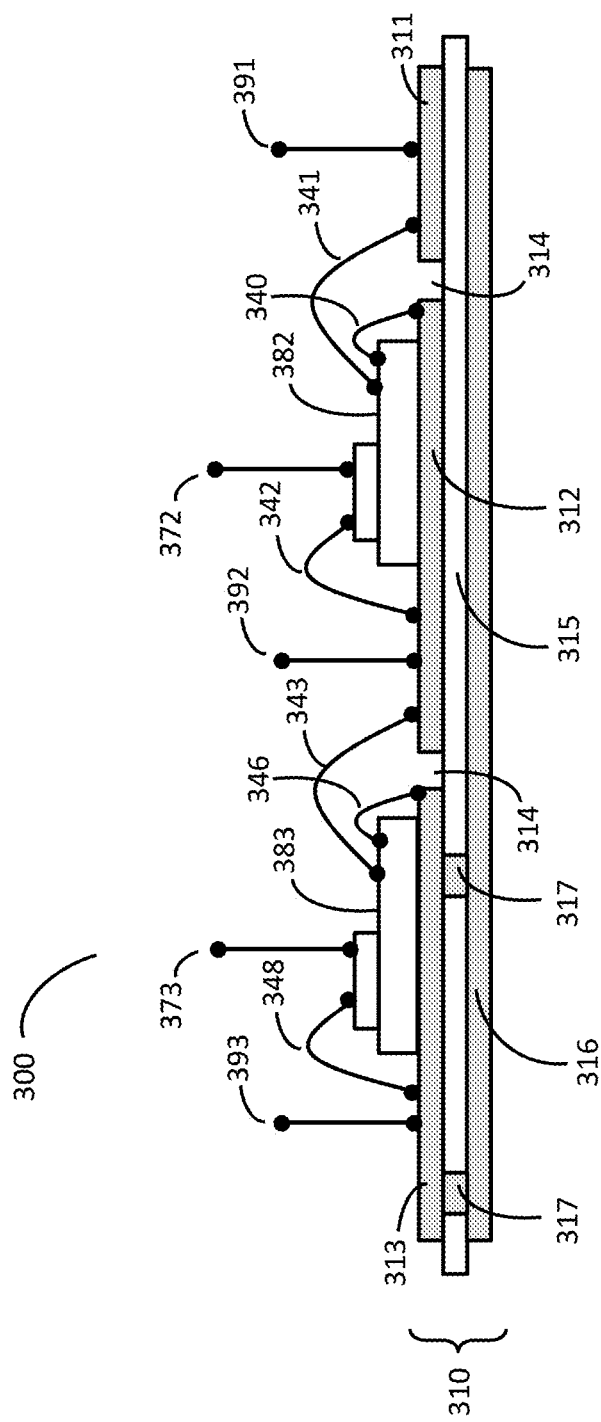
FIG. 3B is a cross sectional view along a portion of the electronic module of FIG. 3A.

FIGS. 3A and 3B show a plan view and a cross-sectional view, respectively, of an electronic module 300. Module 300 includes cascode switches 382 and 383 connected in the half bridge configuration shown in FIG. 1A. A plan view and a cross-sectional view of a cascode switch 400 that can be used for each of switches 382 and 383 is shown in FIGS. 4A and 4B, respectively (other cascode configurations could alternatively be used in place of cascode switch 400).

Figure 4A:
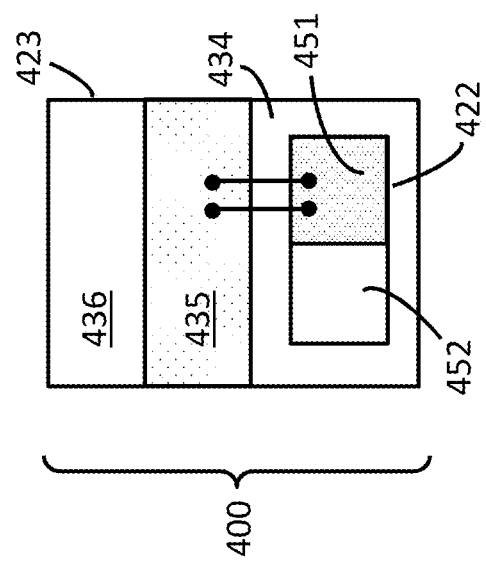
FIG. 4A is a plan view of a low-voltage enhancement-mode transistor coupled to a high-voltage depletion-mode III-N transistor to form a cascode switch.
Figure 4B:
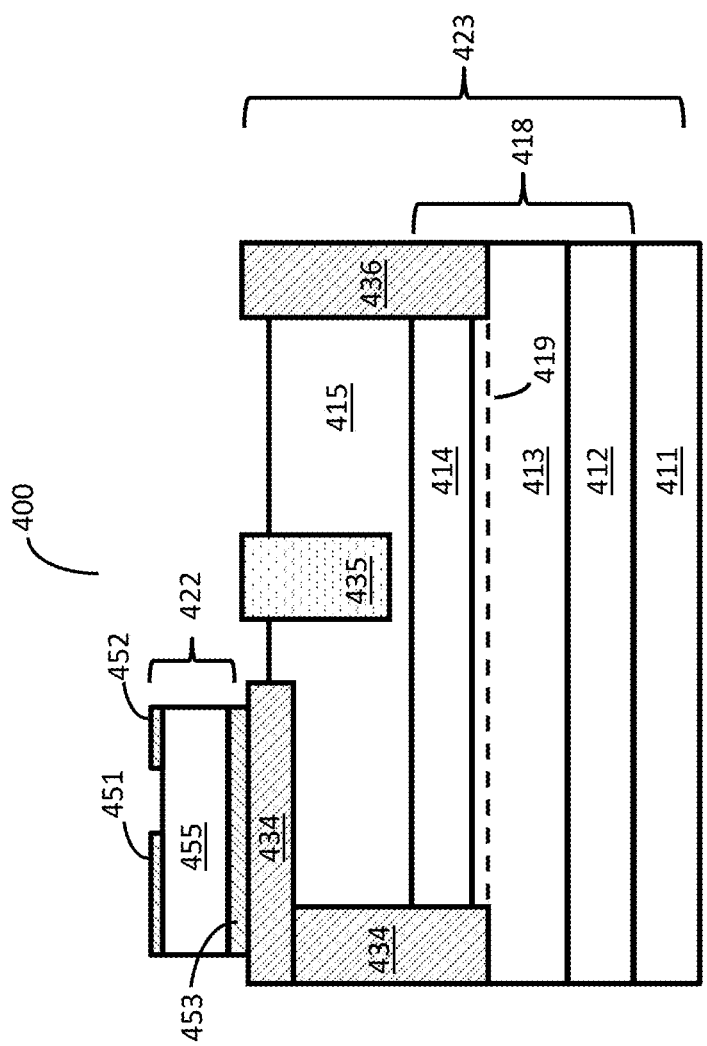
FIG. 4B is a cross-sectional view along a portion of the cascode switch of FIG. 4A.

Referring to FIGS. 4A and 4B, the cascode switch 400 includes a low-voltage E-mode transistor 422 mounted directly on the source pad 434 of a high-voltage D-mode transistor 423, with the drain pad 453 of the E-mode transistor 422 directly bonded to the source electrode 434 of the D-mode transistor 423. The E-mode transistor 422 can, for example, be a silicon FET, and the D-mode transistor can, for example, be a III-N HEMT. The cascode switch 400 can be operated in the same way as a single high-voltage E-mode III-N transistor and in many cases achieves the same or similar output characteristics as a single high-voltage E-mode III-N transistor. The D-mode transistor 423 has a larger breakdown voltage than the E-mode transistor 422 (e.g., at least three times larger). The maximum voltage that can be blocked by the cascode switch 400 while it is biased in the OFF state is at least as large as the maximum blocking or breakdown voltage of the D-mode transistor 423.

The E-mode transistor 422 includes a semiconductor body layer 455. Transistor 422 further includes a FET source electrode 451 and a FET gate electrode 452 on a first side of a semiconductor body layer 455, and a FET drain electrode 453 on a second side of the semiconductor body layer 455 opposite the FET source electrode 451.

The D-mode transistor 423 includes a III-N material structure 418, for example a combination of GaN and AlGaN, grown on a suitable substrate 411, which can be an electrically conductive semiconductor such as silicon (e.g., p-type or n-type Si), GaN (e.g., p-type or n-type GaN), or any other sufficiently electrically conductive substrate, or an insulating (e.g., sapphire) substrate, or semi-insulating (e.g., semi-insulating silicon carbide) substrate.

The III-N material structure 418 can include a III-N buffer layer 412, for example GaN or AlGaN, grown over the substrate 411. The buffer layer 412 can be rendered insulating or substantially free of unintentional n-type carriers. The buffer layer 412 can have a substantially uniform composition throughout, or the composition can vary. The thickness and composition of the buffer layer 412 can be optimized for high-voltage applications. That is, the buffer layer can be capable of blocking a voltage equal to the high-voltage supply or the maximum voltage in the circuit for which it is used. For example the buffer layer 412 may be capable of blocking greater than 600V, or greater than 900V. The thickness of the buffer layer 412 can be greater than 2 µm. For example, the III-N buffer layer can have a thickness between 5 µm and 10 µm.

The III-N material structure can further include a III-N channel layer 413 (e.g., GaN) over the III-N buffer layer 412, and a III-N barrier layer 414 (e.g., AlGaN, AlInN, or AlGaInN) over the III-N channel layer 413. The bandgap of the III-N barrier layer 414 is greater than that of the III-N channel layer 413. The III-N channel layer 413 has a different composition than the III-N barrier layer 414, and the thickness and composition of the III-N barrier layer 414 is selected such that a two-dimensional electron gas (2DEG) channel 419 (indicated by the dashed line in FIG. 4B) is induced in the III-N channel layer 413 adjacent the interface between layers 414 and 413.

Typically, III-N high electron mobility transistors (HEMTs) are formed from epitaxial (i.e., epi) III-N material structures grown by molecular beam epitaxy (MBE) or metalorganic chemical vapor deposition (MOCVD) in a reactor. The III-N material structures can be grown in a group-III polar (e.g., Ga-polar) orientation, such as the [0 0 0 1] (C-plane) orientation, as in the device shown in FIG. 4B. Alternatively, III-N HEMTs can be formed on III-N material structures grown in an N-Polar (i.e., N-face) orientation, such as the [0 0 0–1] orientation (not shown). In an N-polar device, the III-N barrier layer can be over the III-N buffer layer, and the III-N channel layer can be over the III-N barrier layer. N-polar III-N materials have polarization fields in the opposite direction to those of group-III polar III-N materials, thus enabling the implementation of III-N device structures which cannot be formed using group-III polar structures.

An insulator layer 415 (e.g., a dielectric layer) is grown or deposited over the top surface of the III-N material structure 418. The insulator layer 415 can, for example, be formed of or include Aluminum Oxide ($Al_2O_3$), Silicon Dioxide ($SiO_2$), $Si_xN_y$, $Al_{1-x}Si_xN$, $Al_{1-x}Si_xO$, $Al_{1-x}Si_xON$ or any other wide bandgap insulator. Although the insulator layer 115 is shown as a single layer, it can alternatively be formed of several layers and/or materials deposited during different processing steps to form a single combined insulator layer.

A source electrode 434 and a drain electrode 436 are formed on a side of the D-mode transistor 423 opposite the substrate, such that the device 423 is characterized as a lateral III-N device (i.e., the source and drain are on the same side of the device and current flows through the device laterally between the source 434 and the drain 436). The source electrode 434 and the drain electrode 436 are in ohmic contact and electrically connected to the device 2DEG channel 419 that is formed in layer 413. The source and drain electrodes 434 and 436 can each be formed of a stack of multiple metal layers. Each metal stack can, for example, be Ti/Al/Ni/Au, Ti/Al, or another suitable stack of metal layers.

The D-mode transistor 423 further includes a gate electrode 435. The gate electrode 435 can be formed such that the insulator layer 415 extends between and separates the gate electrode 435 from the III-N material structure 418, as shown in FIG. 4B. Alternatively, the gate electrode 435 can be formed such that it is in contact with the III-N material structure 418 (not shown). The gate electrode 435 can be formed of suitable conducting materials such as metal stacks, e.g., titanium/aluminum (Ti/Al) or nickel/gold (Ni/Au). The gate electrode 435 may alternatively be another conductive material or material stack including one or more materials having a large work function, such as a semiconductor material having a large work function (e.g., p-type poly-silicon, indium tin oxide, tungsten nitride, indium nitride, or titanium nitride).

The low voltage E-mode device 422 is electrically connected to the high-voltage D-mode III-N device 423 to form the cascode switch 400, which can be a hybrid III-N device. Here, the drain electrode 453 of the E-mode transistor 422 is directly contacting (e.g., mounted on) and electrically connected to the source electrode 434 of the III-N transistor 423. The drain electrode 453 of the E-mode transistor 422 can be connected to the source electrode 434 of the D-mode transistor 423, for example, with solder, solder paste, conductive epoxy, conductive tape or other suitable attachment methods which allow for a high quality mechanical, thermal, and electrical connection between the FET drain electrode 453 and the D-mode transistor's source electrode 434. The E-mode transistor 422 can be mounted above the 2DEG channel 419, as shown in FIG. 4B, or device 422 can be partially or fully mounted in an area outside the active area of the device such that FET 422 is not above the 2DEG channel layer. The gate node of the cascode switch 400 can be connected to the gate electrode 452 of the E-mode device 422. The D-mode and E-mode transistors of conventional cascode switches are typically co-packed side-by-side on a ceramic insulating substrate, such as an AlN shim, and require an external wire connector to make the FET-drain to HEMT-source connection required in a cascode configuration. However, directly mounting E-mode device 422 on the D-mode device 423, as shown in FIGS. 4A and 4B, can eliminate the need for an external wire connector and a ceramic substrate. This can drastically reduce the parasitic inductance of the circuit, allowing for higher current ratings and faster switching speeds.

Although the gate electrode 435 of the D-mode transistor 423 is not shown in FIG. 4A or 4B to be connected to the source electrode 451 of the E-mode transistor 422 (as required for a cascode switch to operate properly), these two electrodes are in fact electrically connected once the cascode switch 400 is mounted onto module 300 of FIGS. 3A and 3B, since both electrodes are wire bonded to a common metal layer. This can be seen in FIGS. 3A and 3B, and is described in more detail below.

Now referring back to FIGS. 3A and 3B, the module 300 includes a direct bonded copper (DBC) substrate 310 (best seen in FIG. 3B), which can be a base substrate for the module. A DBC substrate is formed by direct bonding of pure copper in a high temperature melting and diffusion process to a ceramic insulator such as AlN or $Al_2O_3$. The DBC substrate 310 includes an insulating (e.g., ceramic or AlN) substrate 315, on which a top metal layer (e.g., copper or nickel) is patterned into at least a first portion 311 that functions as a high-voltage plate, a second portion 312 that functions as an output plate, and a third portion 313 which functions as a ground plate. Portions 311, 312, and 313 are each electrically isolated from one another by a trench 314 formed through the top metal layer. As seen in FIG. 3B, the DBC substrate can included a back metal layer 316 (e.g., copper or nickel) on an opposite side of the insulating substrate 315 from the top metal layer (311/312/313). The ground plate 313 can optionally be electrically connected to the back metal layer 316 by forming metal via holes 317 through the insulating substrate 315. High side switch 382 and low side switch 383 are each a cascode switch as shown in FIGS. 4A and 4B. High side switch 382 is mounted directly on the output plate 312, and low side switch 383 is mounted directly on the ground plate 313.

For the high side switch 382, the drain electrode 436 of the D-mode transistor is electrically connected to high-voltage plate 311 via connector 341, and the gate electrode 435 of the D-mode transistor and the source electrode 451 of the E-mode transistor are both electrically connected to the output plate 312 via wire connectors 340 and 342, respectively. For the low-side switch 383, the drain electrode 436' of the D-mode transistor is electrically connected to output plate 312 via connector 343, and the gate electrode 435' of the D-mode transistor and the source electrode 451' of the E-mode transistor are both electrically connected to the ground plate 313 via wire connectors 346 and 348, respectively.

The electronic module 300 can optionally include a package in which the electronic component is encased, the package including a first input lead 372, a second input lead 373, a high-voltage lead 391, a ground lead 393, and an output lead 392. The first input lead 372 is connected to the gate electrode 452 of the E-mode transistor of high side switch 382, the second input lead 373 is connected to the gate electrode 452' of the E-mode transistor of low side switch 383, the high-voltage lead 391 is connected to the high-voltage plate 311, the ground lead 393 is connected to the ground plate 313, and the output lead 392 is connected to the output plate 312.

In order to ensure proper operation of the half bridge circuit formed by the electronic module 300 of FIGS. 3A and 3B, the high voltage node 391 should be maintained as an AC ground. That is, node 391 can be capacitively coupled to DC ground node 393 by connecting a first terminal of a capacitor 375 to the high-voltage plate 311 and a second terminal of the capacitor 375 to the ground plate 393. As seen in FIG. 3A, the capacitor 375 can be positioned directly over a portion of the via 314. When either switch 382 or 383 is switched on or off, the capacitor 375 can charge or discharge as needed to provide the current necessary to maintain a substantially constant voltage at the high- and low-voltage sides of the circuit. Furthermore, capacitor 375 can also be a hybrid capacitor which includes capacitive and resistive components. For example, capacitor 375 can be constructed as a capacitor and resistor in series. Due to the large di/dt required at high current operations, ringing and voltage spikes can occur during turn-off of the high-side switch or the low-side switch. Typically, the ringing frequencies can be observed in the 100 mHz range. It can be effective to dampen this ringing with a resistor and capacitor in series, as opposed to just a decoupling capacitor. With an operating current of around 30 A, the capacitance value can be in the range of 0.01 nF to 100 nF, and the resistance value can be in the range of 0.1 ohm to 100 ohm. Designers may also choose higher resistor and capacitor values to bias towards under-damped conditions.

Figure 5A:
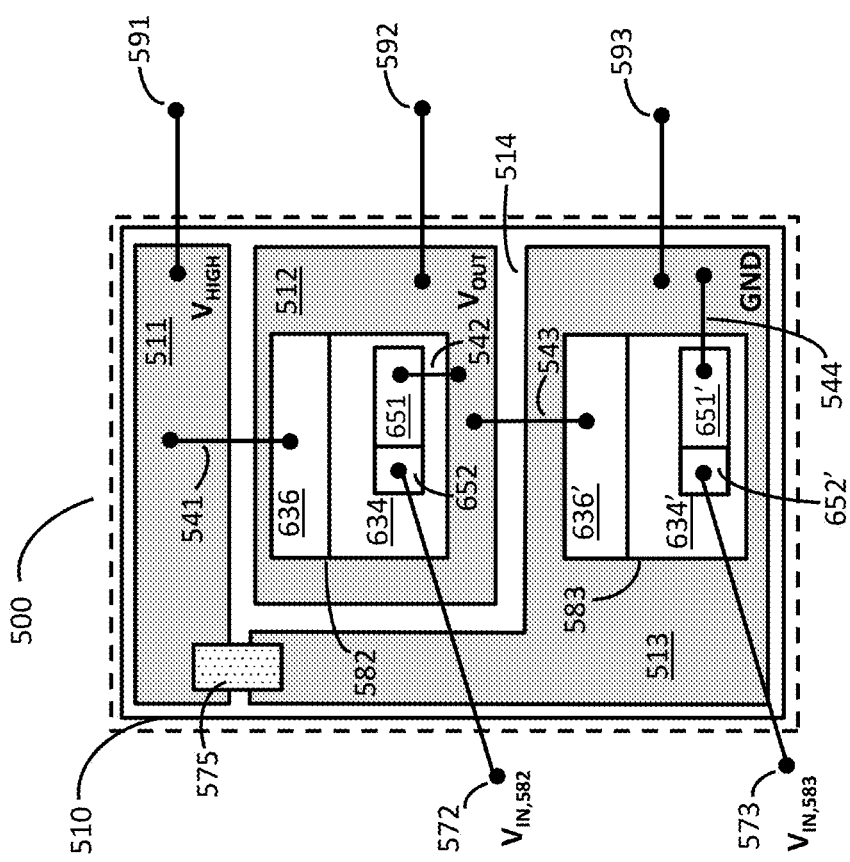
FIG. 5A is a plan view of an electronic module featuring a half bridge.
Figure 5B:
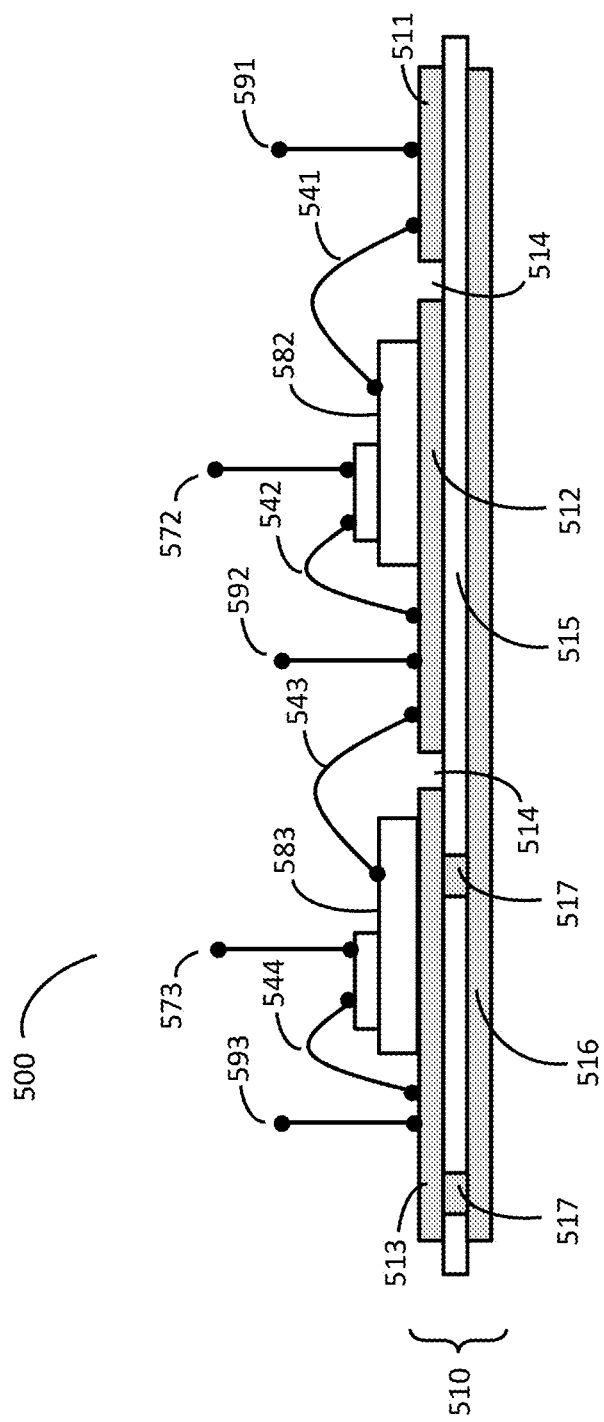
FIG. 5B is a cross sectional view along a portion of the electronic module of FIG. 5A.

A plan view and a cross-sectional view of another electronic module 500 that can provide improved performance and reliability as well as reduced complexity as compared to module 300 is shown in FIGS. 5A and 5B, respectively. The module 500 utilizes cascode switch 600, illustrated in FIG. 6, for its high-side and/or low-side switches 582 and 583, respectively. As described in more detail below, the design of the cascode switch 600 used for switches 582 and 583 allows certain external connectors to be eliminated in module 500, which results in both the reduced complexity as well as improved performance and reliability of module 500.

Figure 6:
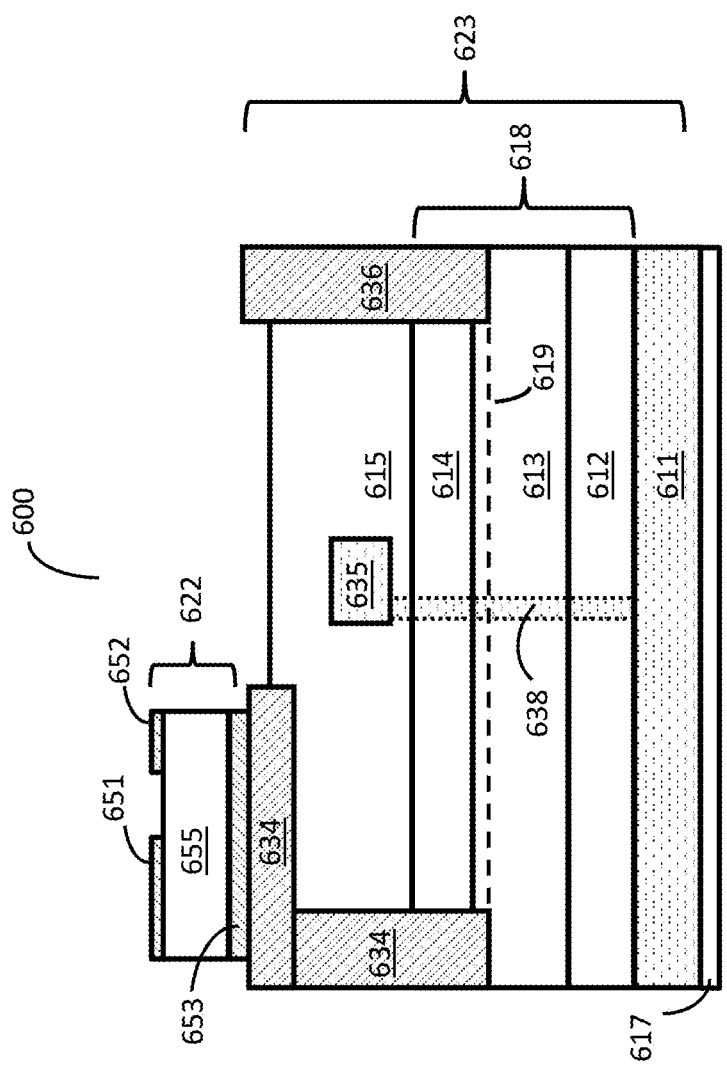
FIG. 6 is a plan view of a low-voltage enhancement-mode transistor coupled to a high-voltage depletion-mode III-N transistor to form a cascode switch.

As seen in FIG. 6, the cascode switch 600 used in module 500 is similar to that of cascode switch 400 used in module 300, but with the addition of a few features. First, the substrate 611 on which the III-N material structure 618 is formed is an electrically conductive substrate (e.g., formed of p-type silicon, n-type silicon, p-type GaN, n-type GaN, or n-type SiC), such that the substrate is electrically connected (i.e., shorted) to the top metal layer of the module 500 onto which the substrate is mounted.

Additionally, the gate electrode 635 of the high voltage D-mode transistor 623 is electrically connected to the conductive substrate 611 by a via-hole 638 (e.g., a through-epi-via or TEV) which is formed through a portion of the III-N material structure 618. The via-hole 638 can be formed through the entire thickness of the III-N material structure 618 and extend all the way to the substrate 611, as indicated by the dashed region 638 in FIG. 6. The metal of the gate electrode 635 is at least partially formed in the via-hole 638 and is in ohmic contact with the conductive substrate 611, such that the gate electrode 635 of the III-N transistor 623 is electrically connected to the conductive substrate 611. Although the dashed region in FIG. 6 shows the via-hole 638 passing through the 2DEG channel 619, the via-hole 638 is formed in a way such that the 2DEG channel 619 is continuous between the D-mode device's source and drain electrodes 634 and 636, respectively (e.g., the via-hole can be formed in a portion of the III-N material that is outside an active region of the III-N transistor).

Finally, a back metal layer 617 (e.g., Ti/Ni/Ag) can optionally be formed on the backside of the conductive substrate 611 opposite the III-N material structure 618. The back metal layer 617 can be used as a bonding layer to allow the substrate 611 to be attached to the underlying metal plane in module 500 with solder, solder paste, conductive epoxy, conductive tape or other suitable attachment methods which allow for a high quality mechanical, thermal, and electrical connection of the device substrate 611 to the metal layer.

Referring back to FIGS. 5A and 5B, in order to form half bridge module 500, a first cascode switch (such as switch 600) is mounted directly on output plate 512 to form the high-side switch 582, and a second cascode switch (such as switch 600) is mounted directly on ground plate 513 to form the low-side switch 583. For the high-side switch 582, because the gate electrode 635 of the D-mode transistor is electrically connected to the conductive substrate 611 by way of via-hole 638, and the conductive substrate is mounted directly to output plate 512, the gate electrode 635 is electrically connected to output plate 512 without the need for an external connector (such as connector 340 in FIGS. 3A and 3B). Similarly, for the low-side switch 583, because the gate electrode 635' of the D-mode transistor is electrically connected to the conductive substrate by way of the via hole, and the conductive substrate is mounted directly to ground plate 513, the gate electrode 635' is electrically connected to ground plate 513 without the need for an external connector (such as connector 346 in FIGS. 3A and 3B). Consequently, assembly of the module 500 is simplified, and circuit inductance is reduce, such that switching noise and EMI is reduced.

For completeness, other aspects and features of module 500 and of the cascode switches 600 used in module 500 are as follows. Referring to FIG. 6, the cascode switch 600 includes a low-voltage E-mode transistor 622 mounted directly on the source pad 634 of a high-voltage D-mode transistor 623, with the drain pad 653 of the E-mode transistor 622 directly bonded to the source electrode 634 of the D-mode transistor 623. The E-mode transistor 622 can, for example, be a silicon FET, and the D-mode transistor can, for example, be a III-N HEMT. The cascode switch 600 can be operated in the same way as a single high-voltage E-mode III-N transistor and in many cases achieves the same or similar output characteristics as a single high-voltage E-mode III-N transistor. The D-mode transistor 623 has a larger breakdown voltage than the E-mode transistor 622 (e.g., at least three times larger). The maximum voltage that can be blocked by the cascode switch 600 while it is biased in the OFF state is at least as large as the maximum blocking or breakdown voltage of the D-mode transistor 623.

The E-mode transistor 622 includes a semiconductor body layer 655. Transistor 622 further includes a FET source electrode 651 and a FET gate electrode 652 on a first side of a semiconductor body layer 655, and a FET drain electrode 653 on a second side of the semiconductor body layer 655 opposite the FET source electrode 651.

The D-mode transistor 623 includes a III-N material structure 618, for example a combination of GaN and AlGaN, grown on an electrically conductive substrate 611, which can, for example, be an silicon (e.g., p-type or n-type Si), GaN (e.g., p-type or n-type GaN), n-type SiC, or any other sufficiently electrically conductive substrate.

The III-N material structure 618 can include a III-N buffer layer 612, for example GaN or AlGaN, grown over the substrate 611. The buffer layer 612 can be rendered insulating or substantially free of unintentional n-type carriers. The buffer layer 612 can have a substantially uniform composition throughout, or the composition can vary. The thickness and composition of the buffer layer 612 can be optimized for high-voltage applications. That is, the buffer layer can be capable of blocking a voltage equal to the high-voltage supply or the maximum voltage in the circuit for which it is used. For example the buffer layer 612 may be capable of blocking greater than 600V, or greater than 900V. The thickness of the buffer layer 612 can be greater than 2 µm. For example, the III-N buffer layer can have a thickness between µm and 10 µm.

The III-N material structure can further include a III-N channel layer 613 (e.g., GaN) over the III-N buffer layer 612, and a III-N barrier layer 614 (e.g., AlGaN, AlInN, or AlGaInN) over the III-N channel layer 613. The bandgap of the III-N barrier layer 614 is greater than that of the III-N channel layer 613. The III-N channel layer 613 has a different composition than the III-N barrier layer 614, and the thickness and composition of the III-N barrier layer 614 is selected such that a two-dimensional electron gas (2DEG) channel 619 (indicated by the dashed line in FIG. 6) is induced in the III-N channel layer 613 adjacent the interface between layers 614 and 613.

Typically, III-N high electron mobility transistors (HEMTs) are formed from epitaxial (i.e., epi) III-N material structures grown by molecular beam epitaxy (MBE) or metalorganic chemical vapor deposition (MOCVD) in a reactor. The III-N material structures can be grown in a group-III polar (e.g., Ga-polar) orientation, such as the [0 0 0 1] (C-plane) orientation, as in the device shown in FIG. 6. Alternatively, III-N HEMTs can be formed on III-N material structures grown in an N-Polar (i.e., N-face) orientation, such as the [0 0 0–1] orientation (not shown). In an N-polar device, the III-N barrier layer can be over the III-N buffer layer, and the III-N channel layer can be over the III-N barrier layer. N-polar III-N materials have polarization fields in the opposite direction to those of group-III polar III-N materials, thus enabling the implementation of III-N device structures which cannot be formed using group-III polar structures.

An insulator layer 615 (e.g., a dielectric layer) is grown or deposited over the top surface of the III-N material structure 618. The insulator layer 615 can, for example, be formed of or include Aluminum Oxide ($Al_2O_3$), Silicon Dioxide ($SiO_2$), $Si_xN_y$, $Al_{1-x}Si_xN$, $Al_{1-x}Si_xO$, $Al_{1-x}Si_xON$ or any other wide bandgap insulator. Although the insulator layer 115 is shown as a single layer, it can alternatively be formed of several layers and/or materials deposited during different processing steps to form a single combined insulator layer.

A source electrode 634 and a drain electrode 636 are formed on a side of the D-mode transistor 623 opposite the substrate, such that the device 623 is characterized as a lateral III-N device (i.e., the source and drain are on the same side of the device and current flows through the device laterally between the source 634 and the drain 636). The source and drain electrodes 634 and 636 can each be formed of a stack of multiple metal layers. Each metal stack can, for example, be Ti/Al/Ni/Au, Ti/Al, or another suitable stack of metal layers.

The D-mode transistor 623 further includes a gate electrode 635. The gate electrode 635 can be formed such that the insulator layer 615 is at least partially between the gate electrode and the III-N material structure 618, as shown in FIG. 6. The gate electrode 435 can be formed of suitable conducting materials such as metal stacks, e.g., titanium/aluminum (Ti/Al) or nickel/gold (Ni/Au).

The low voltage E-mode device 622 is electrically connected to the high-voltage D-mode III-N device 623 to form the cascode switch 600. Here, the drain electrode 653 of the E-mode transistor 622 is directly contacting (e.g., mounted on) and electrically connected to the source electrode 634 of the III-N transistor 623. The drain electrode 653 of the E-mode transistor 622 can be connected to the source electrode 634 of the D-mode transistor 623, for example, with solder, solder paste, conductive epoxy, conductive tape or other suitable attachment methods which allow for a high quality mechanical, thermal, and electrical connection between the FET drain electrode 653 and the D-mode transistor's source electrode 634. The E-mode transistor 622 can be mounted above the 2DEG channel 619, as shown in FIG. 6, or device 622 can be partially or fully mounted in an area outside the active area of the device such that FET 622 is not above the 2DEG channel layer.

Now referring back to FIGS. 5A and 5B, the module 500 includes a direct bonded copper (DBC) substrate 510 (best seen in FIG. 5B) which can be a base substrate for the module. The DBC substrate 510 includes an insulating (e.g., ceramic) substrate 515 on which a top metal layer (e.g., copper) is patterned into at least a first portion 511 that functions as a high-voltage plate, a second portion 512 that functions as an output plate, and a third portion 513 which functions as a ground plate. Portions 511, 512, and 513 are each electrically isolated from one another by a trench 514 formed through the top metal layer. The DBC substrate 510 optionally includes a back metal layer 516 on an opposite side of the insulating substrate 515 from the top metal layer (511/512/513). The ground plate 513 can optionally be electrically connected to the back metal layer 516 by forming metal via holes 517 through the insulating substrate 515. High side switch 582 and low side switch 583 are each a cascode switch as shown in FIG. 6. High side switch 582 is mounted directly on the output plate 512, and low side switch 583 is mounted directly on the ground plate 513.

For the high side switch 582, the drain electrode 636 of the D-mode transistor is electrically connected to high-voltage plate 511 via connector 541, and the source electrode 651 of the E-mode transistor is electrically connected to the output plate 512 via wire connectors 542. For the low-side switch 583, the drain electrode 636' of the D-mode transistor is electrically connected to output plate 512 via connector 543, and the source electrode 651' of the E-mode transistor is electrically connected to the ground plate 513 via wire connector 544. Connectors 541-544 which may comprise single wirebonds (as shown) or multiple parallel wirebonds, ribbons, conductive metal clips, or other connectors comprising conductive materials such as aluminum (Al), gold (Au), copper (Cu), or other appropriate materials.

The electronic module 500 can optionally include a package in which the electronic component is encased, the package including a first input lead 572, a second input lead 573, a high-voltage lead 591, a ground lead 593, and an output lead 592. The first input lead 572 is connected to the gate electrode 652 of the E-mode transistor of high side switch 582, the second input lead 573 is connected to the gate electrode 652' of the E-mode transistor of low side switch 583, the high-voltage lead 591 is connected to the high-voltage plate 511, the ground lead 593 is connected to the ground plate 513, and the output lead 592 is connected to the output plate 512.

In order to ensure proper operation of the half bridge circuit formed by the electronic module 500 of FIGS. 5A and 5B, the high voltage node 591 should be maintained as an AC ground. That is, node 591 can be capacitively coupled to DC ground node 593 by connecting a first terminal of a capacitor 575 to the high-voltage plate 511 and a second terminal of the capacitor 575 to the ground plate 593. As seen in FIG. 5A, the capacitor 575 can be positioned directly over a portion of the via 514. When either switch 582 or 583 is switched on or off, the capacitor 575 can charge or discharge as needed to provide the current necessary to maintain a substantially constant voltage at the high- and low-voltage sides of the circuit. Furthermore, capacitor 575 can also be a hybrid capacitor which includes capacitive and resistive components. For example, capacitor 575 can be constructed as a single component which includes a capacitor and resistor in series. Due to the large di/dt required at high current operations, ringing and voltage spikes can occur during turn-off of the high-side switch or the low-side switch. Typically, the ringing frequencies can be observed in the 100 mHz range. It can be effective to dampen this ringing with a resistor and capacitor in series, as opposed to just a decoupling capacitor. With an operating current of around 30 A, the capacitance value can be greater than 0. InF, for example, in the range of 0.1 nF to 100 nF, and the resistance value can be greater than 0.1 ohm, for example, in the range of 0.1 ohm to 100 ohm. Designers may also choose higher resistor and capacitor values to bias towards under-damped conditions.

Figure 1A:
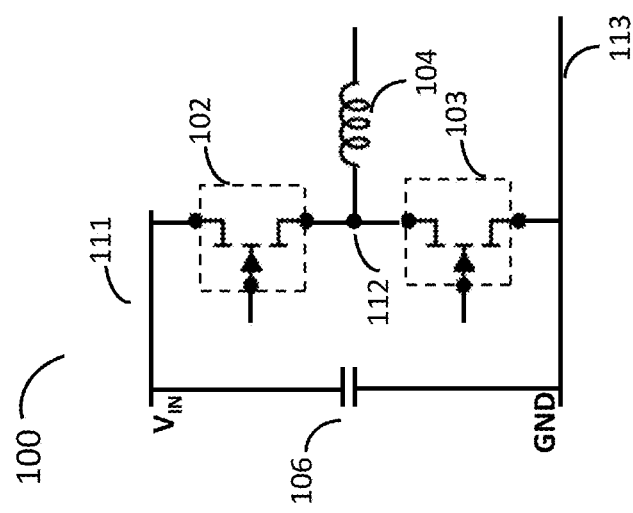
FIG. 1A is a circuit schematic of a half bridge circuit.
Figure 2:
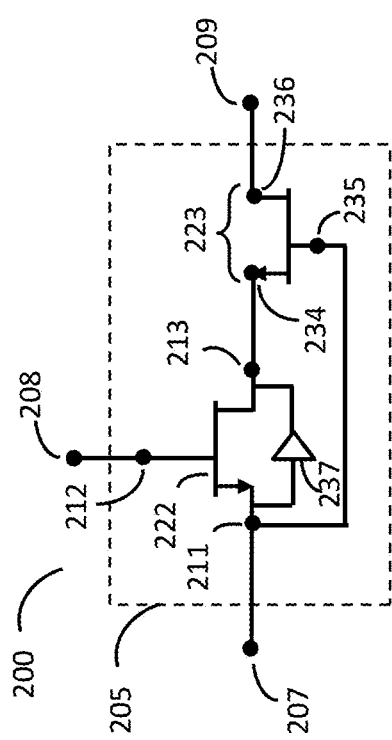
FIG. 2 is a schematic diagram of a hybrid normally-off device arranged in a cascode configuration.

FIGS. 7A, 7B, and 7C show three different modes of operating a half bridge buck-converter circuit, similar to the half bridge of FIG. 1A. The half bridge circuit includes a high-side switch 102 connected to a high voltage node 111 and a low-side switch 103 connected to a ground node 113. An inductor 104 is connected between node 112 (which is between the low-side switch 103 and the high-side switch 102) and the output node Vout of the circuit. A first capacitor 106 is connected between the high-voltage node 111 and the DC ground 113. A second capacitor 107 is connected between the output node Vout of the circuit the DC ground 113. The low-side switch 103 and the high-side switch 102 are selected to have properties that improve the efficiency of the buck converter circuit. Specifically, the switches 102 and 103 should have low on-resistance (RDS(ON)) and low switching loss. The switch 102 and/or 103 can, for example, be formed with the cascode switch 200 of FIG. 2. Or, switch 102 and/or switch 103 can be implemented as the cascode switch 600 of FIG. 6 assembled in the half bridge module 500 of FIG. 5A.

The buck-converter half bridge of FIGS. 7A-7C can be operated as follows: referring to FIG. 7A, in a first mode of operation, the gate of the high-side switch 102 is biased ON (i.e. $V_{GS}102>V_{TH}$) and the gate of the low-side switch 103 is biased OFF (i.e. $V_{GS}103<V_{TH}$). Current 97 flows from the high voltage node 111 in a forward direction through the high-side switch 102 to node 112. The current is blocked by the low-side switch 103 and flows through the inductor 104 as shown by current path 97. While the device is operated in the first mode of operation, if the gate-source voltage of the high-side switch 102 is switched to low or OFF (i.e., to $V_{GS}102<V_{TH}$), such that the gate of both switches 102 and 103 are biased OFF, the half-bridge switches to a second mode of operation shown in FIG. 7B. The current continues to flow through the inductor 104.

FIGS. 7D and 7E shows a circuit schematic of a cascode switch (such as cascode switch 200 of FIG. 2) and also indicates various parasitic inductances and capacitances inherently present in the cascode configuration. The parasitic gate-drain capacitance ($C_{GD}$) of the D-mode III-N transistor 223 is represented as capacitor 57. The intrinsic body diode of the E-mode FET 222 is represented by diode 237. The parasitic inductance of the source connection of E-mode FET 222 is represented as inductor 54, and the parasitic inductance of the gate connection of D-mode III-N transistor 223 is represented as inductor 53. When the circuit of FIGS. 7D and 7E is implemented as the low-side switch 383 in a half bridge module, similar to module 300 of FIG. 3A, the inductor 54 represents the inductance of the wire connecting the source 451' of E-mode transistor to the ground plate 313 (e.g., wire 348 in FIG. 3A). In order for the gate electrode 435' of the D-mode transistor of switch 383 to be connected to the source electrode 451' of the E-mode transistor of switch 383, an external gate wire connector 346 is used to connect the gate electrode 435' of the D-mode transistor to the ground plate 313. This gate wire connector 346 results in a significant inductance (represented by inductor 53 in FIG. 7D) between the gate electrode 435 of the D-mode transistor and the ground plate 313. Parasitic inductances 53 and 54 can slow down the turn-on and turn-off time of the module and increase switching loss, thereby degrading the performance of the circuit.

FIG. 7D illustrates the detailed current path through the cascode configuration of the low-side switch 103 during a transition time Ti, between the first mode of operation and the second mode of operation shown in FIGS. 7A and 7B. During the transition time $T_1$, the voltage at node 112 (shown in FIGS. 7A-7B) is being pulled lower until it becomes negative and a displacement current flows though the parasitic gate-drain capacitor 57 of D-mode III-N transistor 223, as shown by current path $I_{AC}$ in FIG. 7D. When the voltage at node 112 becomes sufficiently negative, although the gate of the low-side switch 103 is biased OFF (i.e., $V_{GS}<V_{TH}$), the intrinsic body diode 237 of the E-mode FET transistor 222 is turned ON and the switch 103 becomes reverse conducting. This is referred to as reverse conduction mode (i.e., free-wheeling diode mode). At the end of the transition time $T_1$, switch 103 transitions from OFF to reverse conducting and the current abruptly transitions from a displacement current through the gate-drain capacitor 57 of D-mode transistor 223 (shown in FIG. 7D) into a reverse DC current which flows through the intrinsic body diode 237 of the E-mode transistor 222 and the channel of the D-mode transistor 223 as indicated by current path IDC in FIG. 7E.

When the operating current through the inductor 104 is high, the current path transition can cause a voltage spike and ringing across the gate of the D-mode transistor 223. This voltage spike will inject charge into the gate dielectric (e.g., insulator layer 415 or 615) of the D-mode transistor and result in an increase in the channel on-resistance ($R_{ON}$) of the D-mode transistor, thereby increasing the on-resistance of the cascode switch 383. The reverse conduction of switch 103 occurs in the circuit of FIG. 7B even though the gate of switch 103 is biased OFF because the current in inductor 104 has to be continuous.

Referring back to FIG. 7C after switching the gate of the high-side 102 OFF, as in FIG. 7B, the low-side switch 103 is switched ON (i.e., to $V_{GS}>V_{TH}$), causing the buck converter to operate in a third mode of operation in which current 98 continues to flow though the low-side switch 103 in the same direction (reverse direction) as the second mode but with the low-side switch 103 biased ON. Biasing the low-side switch ON during the third mode of operation reduces the voltage drop across the E-mode transistor 222 in the reverse direction as compared to the second mode of operation and allows a higher efficiency than compared to the second mode of operation. A sufficient dead time between turning the high-side switch 102 OFF and turning the low-side switch 103 ON is used to prevent accidentally shorting the high voltage node 1111 to ground node 113.

The design of the cascode switch and associated module can be a critical factor for determining the performance of the low-side switch 103 during reverse conduction mode. By implementing device 600 into half bridge module 500 as the low-side device 103, and thereby eliminating the need for an external gate wire connection (such as wire 346 of FIG. 3A) between the D-mode transistor of switch 583 and the ground plate 513 in module 500 (since the D-mode transistor gate is connected to the ground plate 513 through via hole 638), parasitic inductance (shown by inductor 53 in FIG. 7D) in the half bridge module is reduced. This in turn reduces the voltage spike and ringing experienced at the gate of the D-mode transistor of switch 583 during the current path transition between the first mode of operation and the second mode of operation. Surprisingly, this was shown to significantly lower the degradation (i.e., increase) of the channel on-resistance of the switch when operated at very high reverse DC currents compared to conventional modules with an external gate wire. This result was unexpected. The contribution of the gate-wire inductance from the depletion-mode transistor to the module switching performance was thought to be negligible to the inventors, since there is no DC current which flows in this path, and the gate voltage of the depletion-mode transistor of the low-side switch is usually pinned to ground. This degradation in on-resistance is commonly referred to as current-collapse or dispersion, which is a major concern to the implementation of III-N devices in half-bridge circuits. When cascode switch 600 is implemented in the half bridge module 500 as the low-side switch 583, the switch 583 is capable of operating with a reverse DC current during the second and third mode of operation greater than 50 A, or even greater than 70 A, while exhibiting almost no increase in on-resistance. For example, the increase in on-resistance can be less than 5% relative to the first mode of operation. Conventional modules with an external gate wire connection can typically exhibit an increase of on-resistance of greater than 30% or more, even while operating at reverse DC currents of 30A or less. The low-side switch 583 is capable of blocking a voltage greater than 600V during the first mode of operation.

In addition, the high-side switch 582 can be operated in reverse conduction mode during certain switching sequences. Here, the gate connection between the D-mode III-N transistor of cascode switch 582 and the output plate 512 is connected through the via-hole 638, and parasitic inductance in the electronic module is further reduced. This further reduces the voltage spike and ringing experienced by the cascode switch 582 during the current path transition when switching into reverse conduction mode.

FIG. 8 is a top view of an integrated electronic module 800 which forms a half bridge circuit similar to the integrated electronic half bridge module 500 of FIG. 5A with an alternative DBC 810 layout which enables a more compact orientation of the high voltage plate 811, the output plate 812, and the ground plate 813 compared to the module 500 of FIG. 5A. This can reduce the electronic module size and foot print, as well as lower cost. Module 800 also includes high-side source sense node 896 and low-side source sense node 897. Although not shown in FIG. 5A, module 500 can also include sense nodes 896 and 897. High-side source sense node 896 is connected to the output plate 812 and low-side source sense node 897 is connected to the ground plate 813. First input lead 872, high-side source sense node 896, second input lead 873, and low-side source sense node 897 (collectively, the gate nodes) extend from a first side of the module 800 such that all the gate nodes extend from the same side of the module and are configured to be connected to an external gate driver. In some instances the high-side gate nodes can be connected to a high-side gate driver and the low-side gate nodes can be connected to a low-side gate driver. High-voltage node 891, ground node 893 and output node 892 extend from a second side of module 800 opposite the first side, where high-voltage node 891 is configured to be connected to the circuit high voltage supply, ground node 893 is configured to be connected to circuit ground, and output node 892 is configured to be connected to a inductive component or circuit load. High-side switch 882 is orientated with a 90° rotation compared to the low-side switch 883 in module 800, to allow for more compact arrangement of the module components and to allow for shorter wire bond connections to the DBC 810. In particular, in the high-side switch 882, the source electrode 634, and drain electrode 634 are arranged along a first axis, whereas in the low-side switch 883, the source electrode 634' and drain electrode 634' are arranged along a second axis perpendicular to the first axis.

Figure 9:
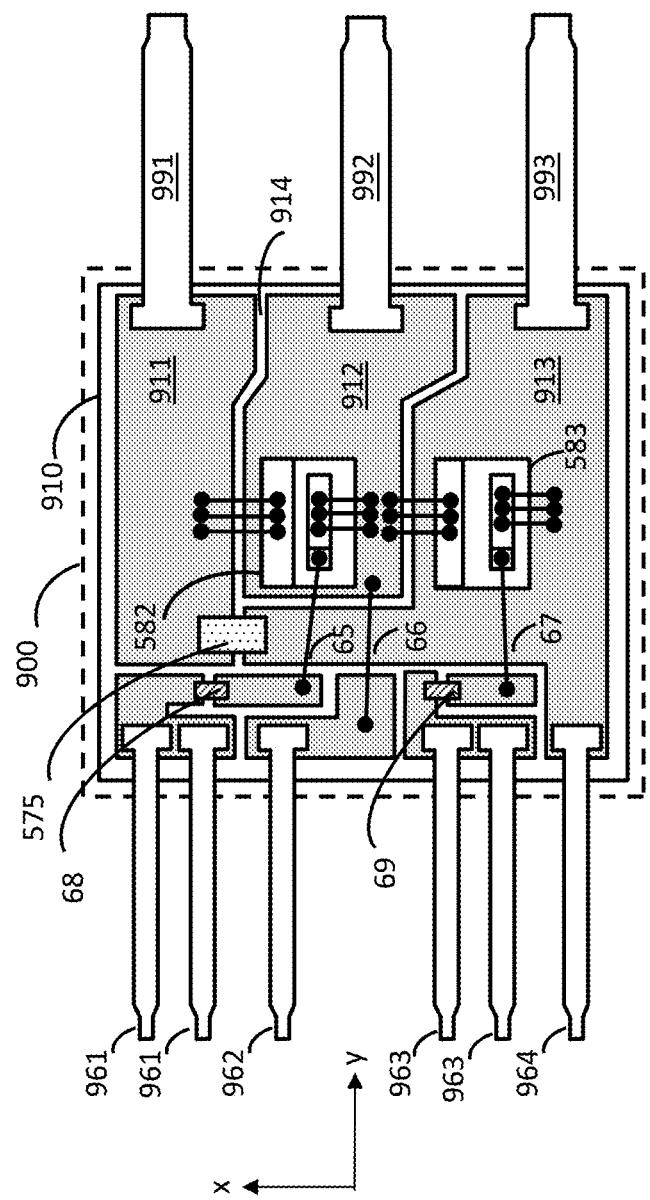
FIGS. 9-12 are plan views of electronic modules each featuring a half bridge in an SMPD type package.

FIG. 9 is a top view of an integrated electronic module 900 which forms a half bridge circuit integrated into a surface mount power device (i.e., SMPD) type package. The half bridge circuit configured in electronic module 600 is similar to module 500 of FIG. 5A, but includes additional metal routing layers on DBC 910 and connector leads to accommodate source sensing pins and gate-connected ferrite beads. Electronic module 900 includes a high-side switch 582 and a low-side switch 583, which can be the same as module 500 of FIG. 5A. Module 900 includes DBC 910 which includes a high-voltage plate 911, output plate 912, and ground plate 913, where each plate is separated by trench 914 formed in the top metal layer of DBC 910. DBC 910 can be constructed in a similar manner as DBC 510 of FIG. 5A and FIG. 5B, however the separation pattern from trench 914 results in an alternate top metal layer configuration. Electronic module 900 further includes an high-voltage lead 991 connected to the high-voltage plate 911, a output lead 992 connected to the output plate 912, and a ground lead 993 connected to the ground plate 913. Electronic module 900 further includes a first input lead 961

(which can be multiple leads), high-side source sense lead 962, a second input lead 963 (which can be multiple leads), and low-side source sense lead 964. Module 900 includes hybrid capacitor 575 which is connected between the high-voltage plate 911 and the ground plate 913, similar to module 500 of FIG. 5A.

FIG. 9 further includes an optional high-side ferrite bead 68 and an optional low-side ferrite bead 69. The high-side ferrite bead 68 includes a first terminal which is electrically coupled to the first input lead 961 and a second terminal which is electrically coupled to a first side of the high-side gate connector 65. High-side gate connector 65 includes a second side which is connected to the gate electrode of the E-mode transistor of cascode switch 582. The low-side ferrite bead 69 includes a first terminal which is electrically coupled to the second input lead 963 and a second terminal which is electrically coupled to a first side of low-side gate connector 67. Low-side gate connector 67 includes a second side which is connected to the gate electrode of the E-mode transistor of cascode switch 583. Electronic module 900 further includes source sense connector 66 which has a first side electrically connected to the high-side source sense node 962 and a second side electrically connected to the output plate 912. Connector 66 is used to bridge the ground plate 913 and allow for the high-side source sense node 962 to be at the same electrical potential as the source of the high-side switch 582. Connectors 65, 66, and 67 may comprise single wirebonds (as shown) or multiple parallel wirebonds, ribbons, conductive metal clips, or other connectors comprising conductive materials such as aluminum (Al), gold (Au), copper (Cu), or other appropriate materials.

As seen in FIG. 9, the high-side switch 582 is directly mounted to the output plate 912 which results in the gate of D-mode III-N transistor of cascode switch 582 being directly electrically connected to the output plate 912 through the substrate of cascode switch 582 without the use of an external wire connector. Also, the low-side switch 583 is directly mounted to the ground plate 913 which results in the gate of D-mode III-N transistor of cascode switch 583 being electrically connected to the ground plate 912 through the substrate of switch 583 without the use of an external wire connector. A hybrid Capacitor 575 is connected on the input side of module 900 between the first input lead 931 and the high-side switch 582. The integration of the cascode switches 582 and 583 into the SMPD type package allows a simplified and efficient integration of a half bridge circuit into an industry standard power device package.

Figure 10:
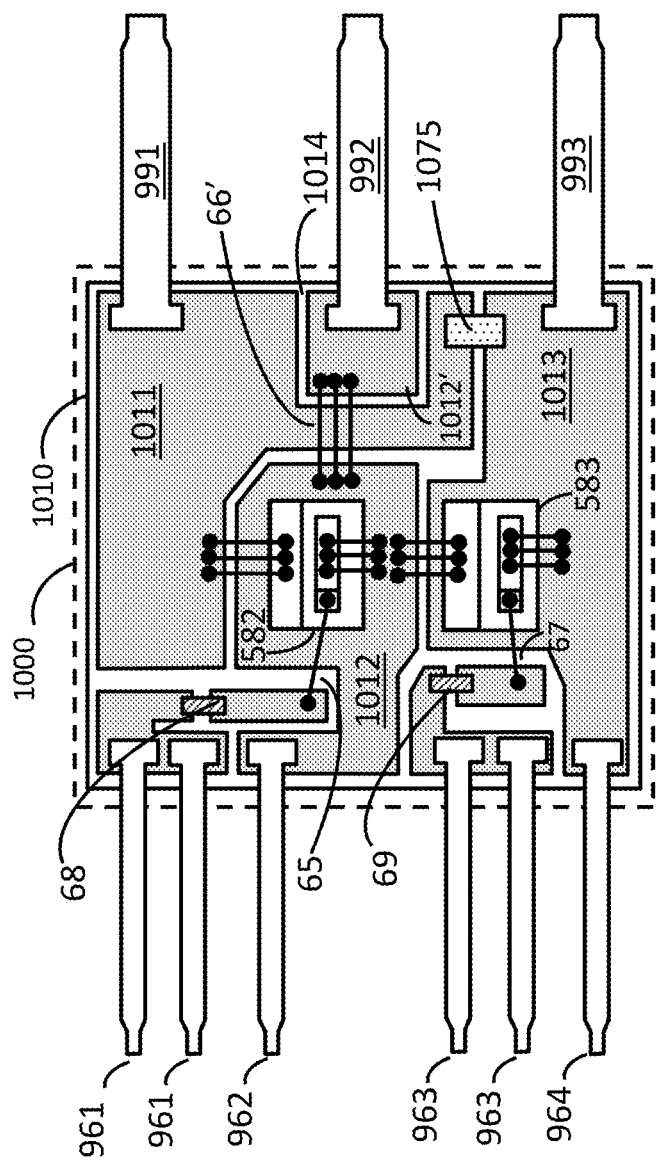

FIG. 10 is a top view of an integrated electronic module 1000 which is similar to electronic module 900 of FIG. 9, however module 1000 connects the hybrid capacitor 1075 between the high-voltage plate 1011 and the ground plate 1013 on the output side of the module 1000 compared to the input side of the module as shown in FIG. 9. Module 1000 includes DBC 1010 which includes a high-voltage plate 1011, output plate 1012, and ground plate 1013, where each plate is separated by trench 1014 formed in the top metal layer of DBC 1010. DBC 1010 can be constructed in a similar manner as DBC 510 of FIG. 5A and FIG. 5B, however the separation pattern from trench 1014 results in an alternate top metal layer configuration. Here, high-side switch 582 and source sense lead 962 are both directly connected to a first output plate 1012 and connector 66 of FIG. 6 is eliminated. Connector 66' of module 1000 has a first side connected to output plate 1012 and a second side connected to a second output plate 1012'. Output node 992 is directly contacting the second output plate 1012' such that the output node 992 and the source of the cascode switch 582 are at the same electrical potential.

Figure 11:
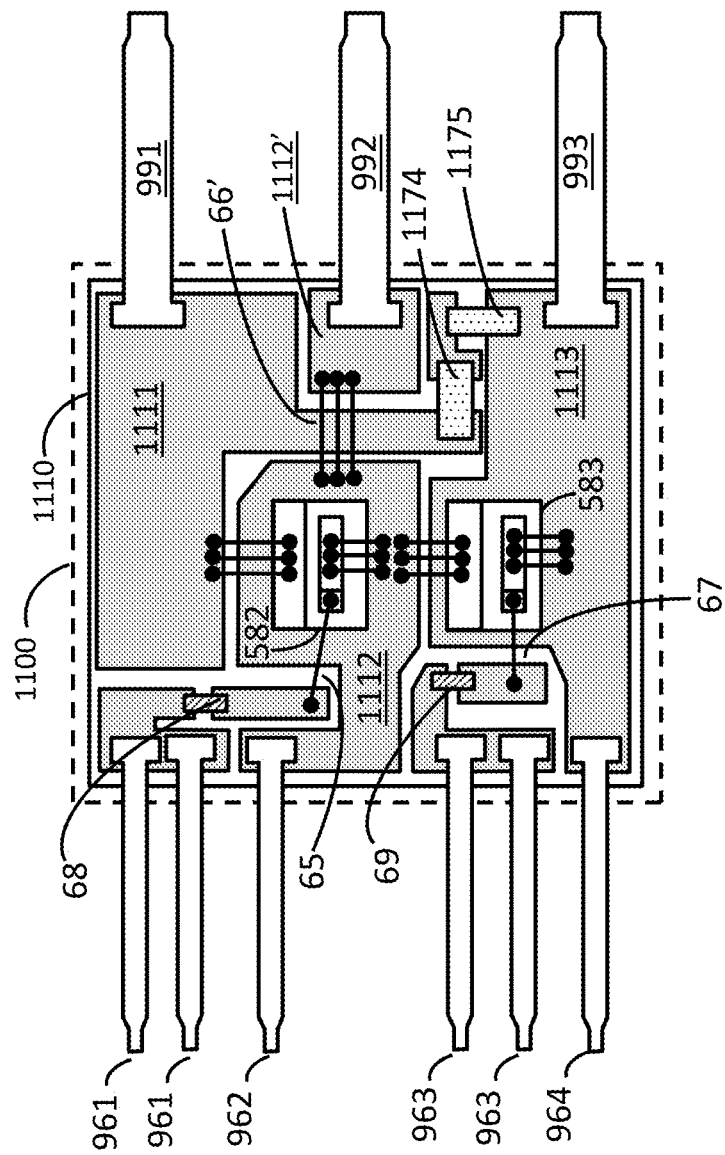

FIG. 11 is a top view of integrated electronic module 1100 which is similar to electronic module 1000 of FIG. 10, however, module 1100 includes capacitor 1174 and resistor 1175 as two separate discrete components connected in series (as opposed to module 1000 which uses a single hybrid component 1075) to connect the high-voltage plate 1111 to the ground plate 1113 in order to maintain the high-voltage plate 1111 to AC ground on DBC 1110. Using two separate discreate components allows for additional component choices to be used by a circuit designer to modify package performance. In addition, the relative order of capacitor 1174 and resistor 1175 in the series circuit can be switched.

Figure 12:
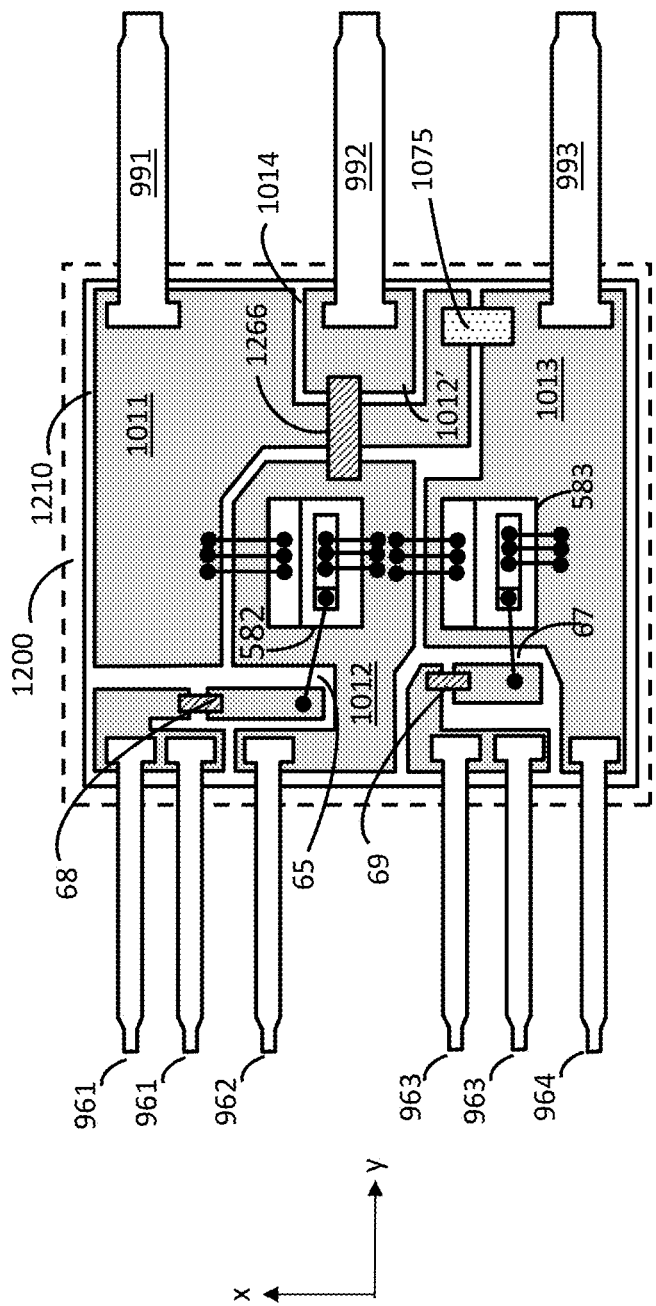

FIG. 12 is a top view of an integrated electronic module 1200 which is similar to electronic module 1000 of FIG. 10, however module 1200 is implemented using a source ferrite bead 1266 which has a first terminal electrically coupled to the source voltage of the high-side switch 582 and a second terminal which is electrically coupled to the output lead 992. Source ferrite bead 1266 can be implemented such that the ferrite bead bridges the high-voltage plate 1011 similar to connector 66' in FIG. 10. Implementing module 1200 with source ferrite bead 1266 instead of using connector 66' can serve to reduce voltage ringing and other switching noise at the output node which can further improve operation of the half bridge module.

FIG. 13A and FIG. 13B show a side view and top view, respectively, of an external rendering of the fully encapsulated SMPD type package which can be used for modules 900-1200. The encapsulated package includes molding compound 1311 which can be plastic, epoxy, metal or other suitable material to hermetically seal and electrically encapsulate the components of the integrated electronic module.

The integrated electronic modules 900, 1000, 1100, and 1200 show a surface mount power device (SMPD) package type, however alternative module packages can be used such as a quad flat no-lead (QFN), or loss-free package (LFPAK) or other type of appropriate module package which can adequately house the high-side 582 and low-side switches 583 to form a half bridge circuit. Additionally the components of the modules 900-1200 may be oriented or arranged in a manner which best suits the needs of the designer and package type.

Figure 14:
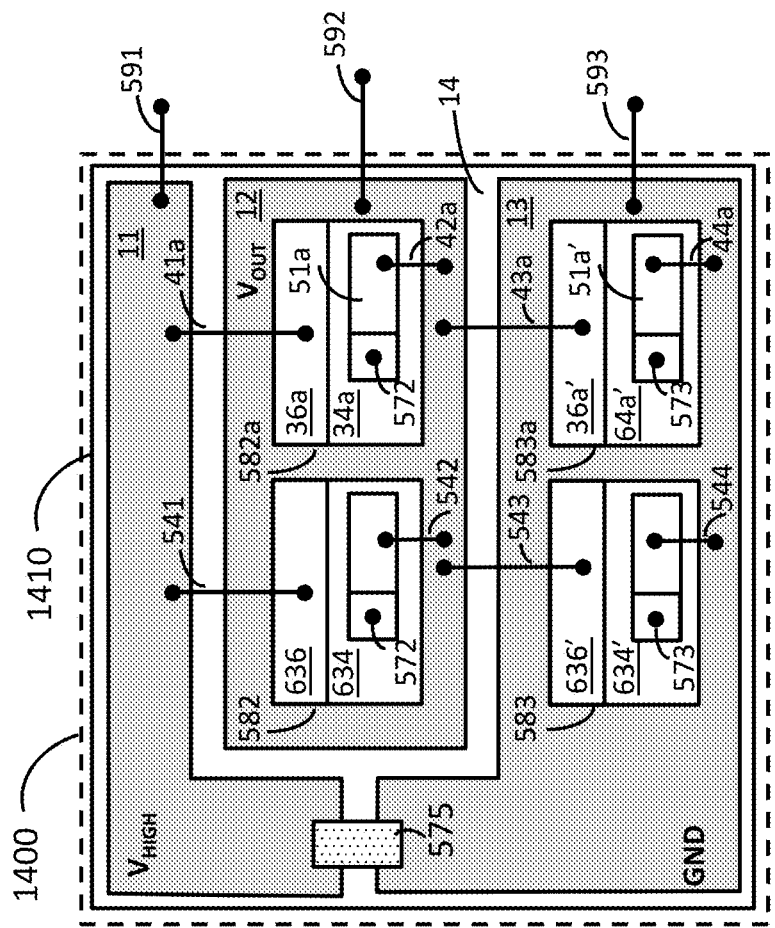
FIG. 14 is a plan view of an electronic module featuring two half bridges configured in parallel.

FIG. 14 is a top view of an integrated electronic module 1400 which is similar to electronic module 500 of FIG. 5A, however module 1400 is implemented using two high-side switches (582 and 582a) connected in parallel and two low-side switches (583 and 583a) connected in parallel. Connector 41a connects the high-voltage plate 11 to the drain electrode 36a of the D-mode transistors of high-side switch 582a. Connector 42a connects the source electrode 51a of the E-mode transistor of high-side switch 582a to the output plate 12. Connector 43a connects the output plate 12 to the drain electrode 36a' of the D-mode transistor of the low-side switch 583a and connector 44a connects the source electrode 51a' of the E-mode transistor of low-side switch 583a to the ground plate 13. The first input lead 572 is connected to the gate electrode of the E-mode transistor of each high-side switch 582 and 82a, and second input lead 573 is connected to the gate electrode of the E-mode transistor each low-side switch 583 and 583a. Here, the substrate of the first high-side switch 582 and the substrate of the second high-side switch 582a are both contacting and electrically connected to the same portion of the top metal layer of the DBC 1410 which forms the output plate 12.

Also, the substrate of the first low-side switch 583 and the substrate of the second low-side switch 583a are both contacting and electrically connected to the same portion of the top metal layer of the DBC 1410 which forms the ground plate 13. Configuring the module 1400 with multiple switches connected in parallel by mounting the switches to the same portion of the top metal layer can improve the operating performance of the module and enable a much higher overall power rating.

During the operation of module 1400, when the first input lead 572 is switched ON or OFF, both switches 582 and 582a are switched ON or OFF simultaneously. Similarly, when the second input lead 573 is switched ON or OFF, both switches 583 and 583a are switched ON or OFF simultaneously. Typically, when half-bridge circuits are paralleled using multiple discrete components, external routing wires are used which can create circuit matching issues when switched at high speeds. Integrating the switching transistors into the same electronic module can reduce switching mismatch issues and improve overall circuit performance. Although two high-side and two low-side switches are shown in FIG. 14, there could be for example, 3 or 4 high-side and low-side switches connected in parallel. In theory there is no limit to the number of switches which could be paralleled in this manner.

Referring back to FIG. 1B, a circuit schematic of a 3-phase full bridge circuit 120 is shown. Each of the three half bridges 122, 124, and 126 in circuit 120 can be implemented with an integrated electronic module such as the electronic modules 300-1400 as described in this specification.

Figure 1B:
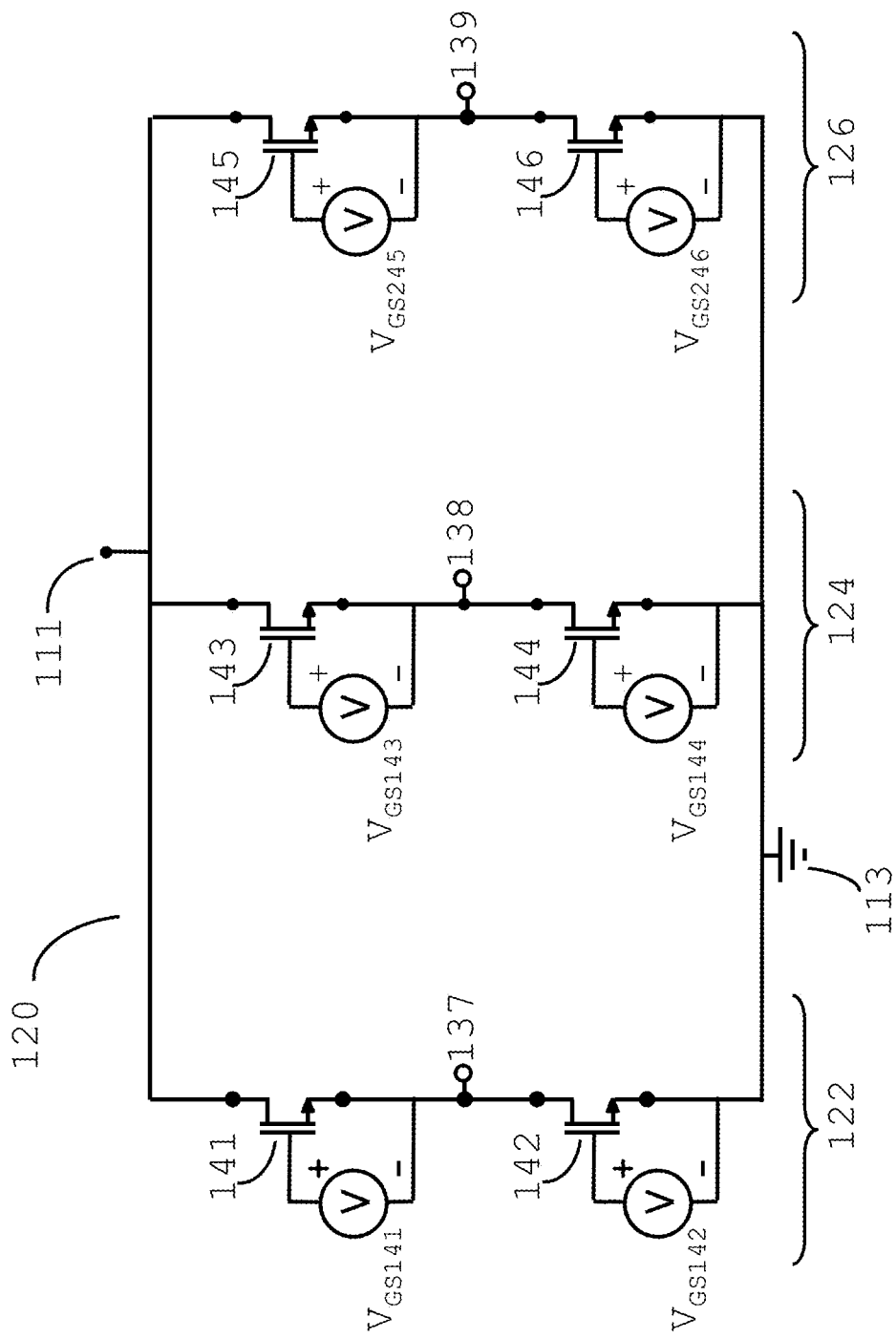
FIG. 1B is a circuit schematic of a 3-phase bridge circuit.
Figure 15:
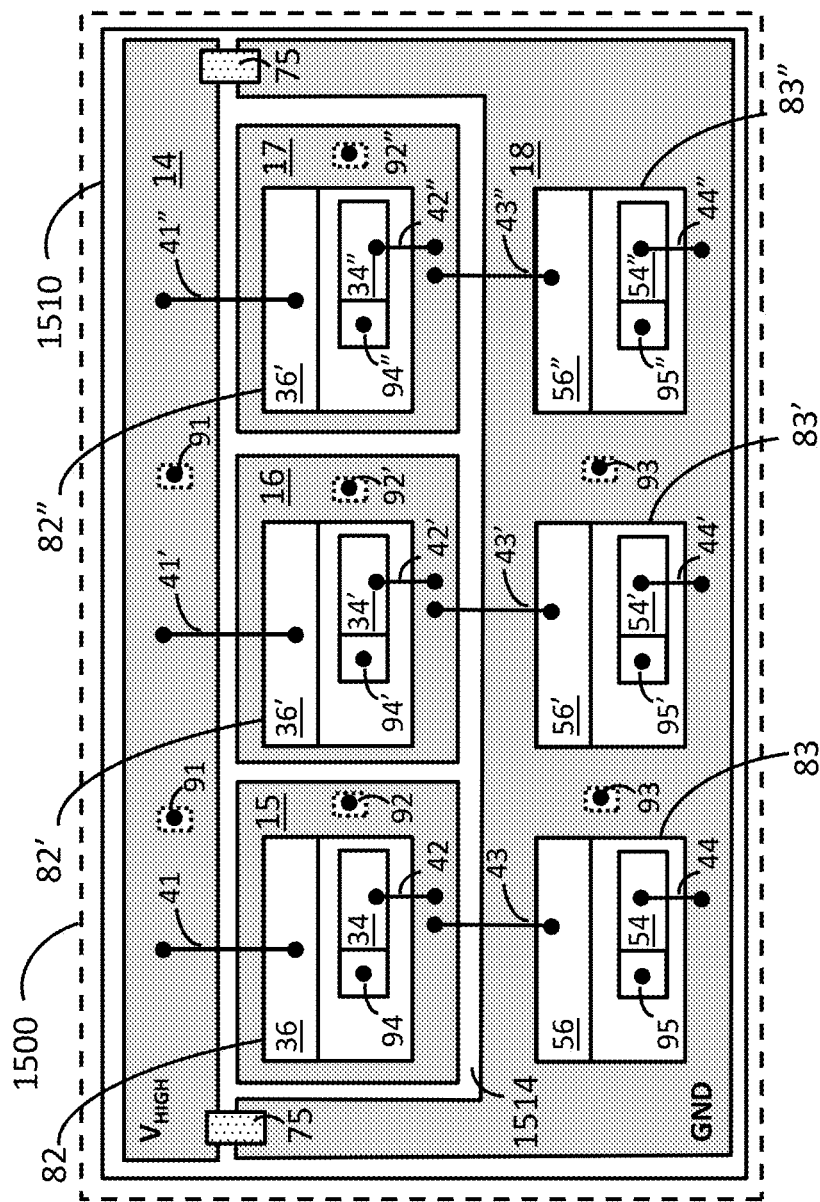
FIG. 15 is a plan view of an electronic module featuring a 3-phase bridge circuit.

FIG. 15 is top view of an electronic module 1500 which includes an integrated 3-phase full bridge circuit such as the circuit 120 of FIG. 1B in a single package. The first phase half bridge circuit includes high-side switch 82 and low-side switch 83. The second phase half bridge circuit includes high-side switch 82' and low-side switch 83'. The third phase half bridge circuit includes high-side switch 82" and low-side switch 83". All high-side and low side switches can be implemented with the cascode switch 600 of FIG. 6. Module 1500 includes DBC layer 1510 where the top metal layer of DBC 1510 is patterned into at least five portions separated by a trench 1514 which is formed through the top metal layer of DBC 1510. The first portion functions as the high-voltage plate 14 which is configured to be connected to a DC high voltage input through high-voltage lead 91. The second portion functions as output plate 15 which is connected to the output node of the first phase 92. The third portion functions as output plate 16 which is connected to the output node of the second phase 92'. The fourth portion functions as output plate 17 which is connected to the output node of the third phase 92". The fifth portion functions as the ground plate 18 which is configured to be connected to DC ground through ground lead 93.

The substrates of high-side switches 82, 82' and 82" are contacting and electrically connected to output plate 15, 16, and 17 respectively. The substrates of low-side switches 83, 83' and 83" are contacting and electrically connected to ground plate 18 such that all low-side switches are contacting and electrically connected to the same metal portion of the DBC 1510. The substrates of high-side switches 82, 82' and 82" are each electrically isolated from one another. The drain electrode 36 of the D-mode transistor node of high-side switch 82 is connected to the high voltage plate 14 with connector 41, the drain electrode 36' of the D-mode transistor of high-side switch 82' is connected to the high voltage plate 14 with connector 41', and the drain electrode 36" of the D-mode transistor of high-side switch 82" is connected to the high voltage plate 14 with connector 41". The source electrode 34 of the E-mode transistor node of high-side switch 82 is connected to the output plate 15 with connector 42, the source electrode 34' of the E-mode transistor of high-side switch 82' is connected to output plate 16 with connector 42', and the source electrode 34" of the E-mode transistor of high-side switch 82" is connected to the output plate 17 with connector 42". The drain electrode 56 of the D-mode transistor of low-side switch 83 is connected to first phase output plate 15 with connector 43, the drain electrode 56' of the D-mode transistor of low-side switch 83' is connected to second phase output plate 16 with connector 43', and the drain electrode 56" of the D-mode transistor of low-side switch 83" is connected to the third phase output plate 17 with connector 43". The source electrode 54 of the E-mode transistor node of low-side switch 83 is connected to the ground plate 18 with connector 44, the source electrode 54' of the E-mode transistor of low-side switch 83' is connected to ground plate 18 with connector 44', and the source electrode 54" of the E-mode transistor of low-side switch 83" is connected to the ground plate 18 with connector 44".

The gate driver operates module 1500 using three independent gate signals to operate the high-side switches and three independent gate signals to operate the low-side switches. Each independent high-side gate signal from the gate driver can be can be connected to gate input nodes 94, 94' and 94", while each independent low-side gate signal from the gate driver can be connected to gate input nodes 95, 95' and 95". Integrating the 3-phase full bridge circuit 120 of FIG. 1B into a single integrated electronic device module 1500 can greatly improve switching efficiency while simultaneously reducing circuit complexity. Although not shown for simplicity, module 1500 can include an integrated gate driver encased in the same package as the components of module 1500. The gate driver can be configured in a similar manner as described below in regards to FIG. 16.

Figure 16:
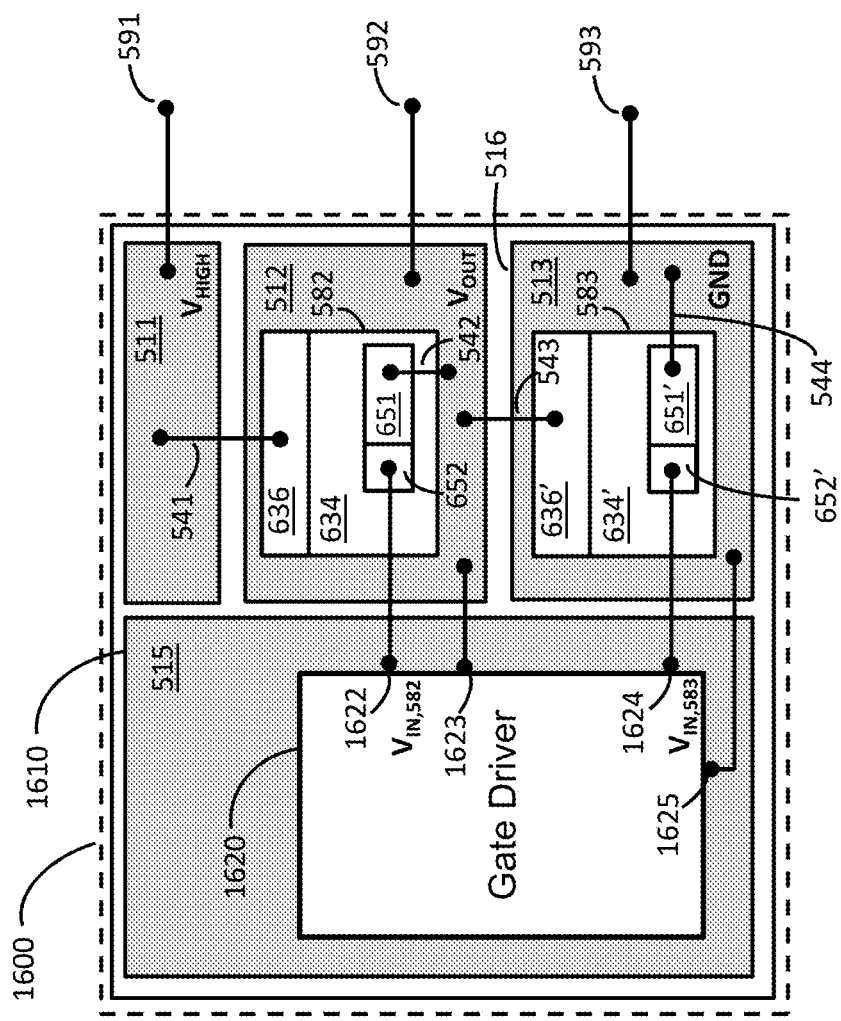
FIG. 16 is a plan view of an electronic module featuring a half bridge with an integrated gate driver.

FIG. 16 is a top view of an integrated electronic module 1600 which forms a half bridge circuit similar to the integrated electronic half bridge module 500 of FIG. 5A. However, module 1600 also includes a gate driver 1620 integrated within the same module packaging as the high-side switch 582 and the low-side switch 583. Like numbered components include the same or similar features as those in module 500. Module 1600 includes DBC 1610. DBC 1610 includes the high voltage plate 511, the output plate 512, and the ground plate 513, and optionally a driver plate 515, all separated by trench 516. Gate driver 1620 can be mounted to the driver plate 515, or alternatively the gate driver 1620 can be directly mounted to the constructive package base of the module, such as a copper or Ni lead frame (not shown). Driver plate 515 can be configured into multiple portions in order to accommodate and attach multiple leads extending from or connected to gate driver 1620. Gate driver 1620 at least includes a first terminal 1622 (VIN 582) which connects to the gate electrode 652 of the E-mode transistor of high side switch 582. The gate driver 1620 includes a second terminal 1623 which is a high-side source-current sense node, and is connected to the output plate 512, or optionally connected directly to the source electrode 651 of the of the E-mode transistor of high side switch 582 (not shown). Gate driver 1620 includes a third terminal 1624 (VIN 583) which connects to the gate electrode 652' of the E-mode transistor of low-side switch 583. The gate driver 1620 includes a fourth terminal 1626 which is a low-side source-current sense node, and is connected to the ground plate 513, or optionally connected directly to the source electrode 651' of the of the E-mode transistor of high side switch 583 (not shown). Although the integration of the gate driver 1620 into the module 1600 increases the cost and complexity compared to module 500, the overall performance of module 1600 can be better than that of module 500 which is operated with an external gate driver. In addition, the overall size of the electronic circuit components for which module 1600 may be incorporated can be reduced, resulting in cost savings and other advantages. Although not shown, gate driver 1620 can alternatively be two discrete gate drivers, such that the first gate driver is connected to the high-side switch and the second gate driver is connected to the low-side switch.

Figure 17:
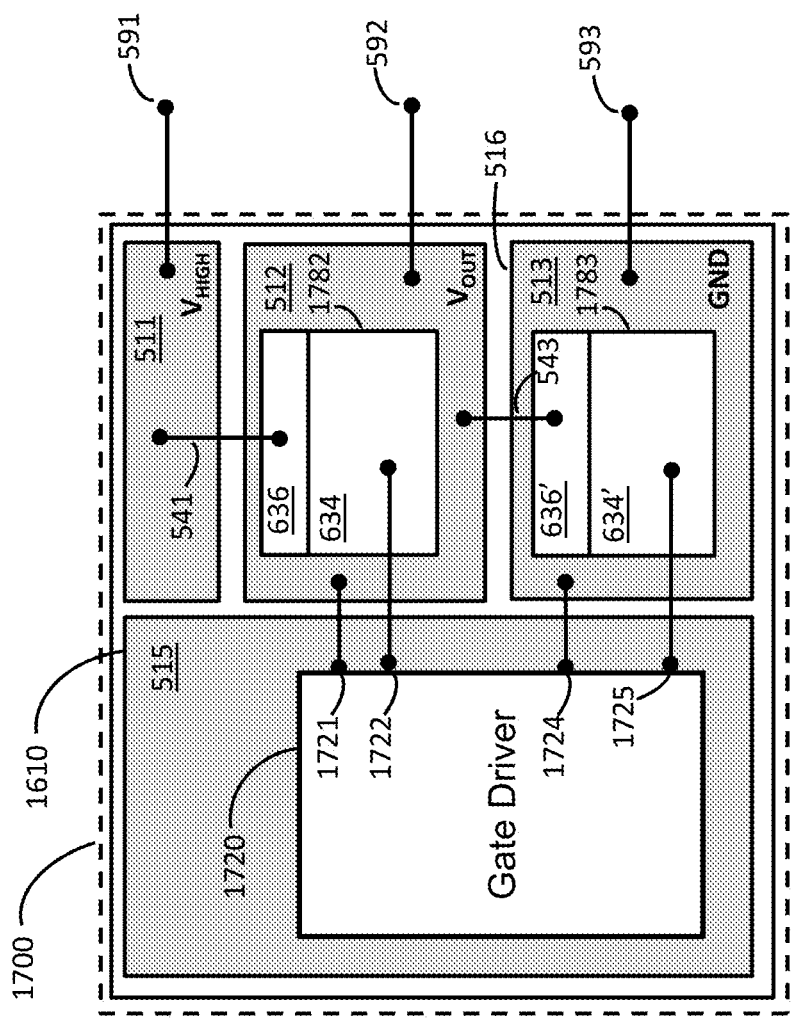
FIG. 17 is a plan view of an electronic module featuring a half bridge with an integrated gate driver.

FIG. 17 is a top view of an integrated electronic module 1700 which forms a half bridge circuit similar to the integrated electronic half bridge module 1600 of FIG. 16. However, module 1700 includes a gate driver 1720 in which the E-mode transistor of high-side switch 582 and the E-mode transistor of low-side switch 583 is integrated within the gate driver 1720. The high-side D-mode III-N transistor 1782 is mounted to the output plate 512 and the low-side D-mode III-N transistor 1783 is mounted to the ground plate 513. Gate driver 1720 at least includes a first terminal 1721 which connects to the source of the integrated E-mode transistor of the high-side switch to the output plate 512. This connection couples the source of the E-mode transistor to the output terminal 592 as well as the conductive substrate of the high-side D-mode III-N transistor 1782. The gate driver 1722 includes a second terminal 1722 which connects the drain of the integrated E-mode transistor of the high-side switch to the source electrode 634 of the high-side D-mode III-N transistor 1782. Gate driver 1720 includes a third terminal 1724 which connects to the source of the integrated E-mode transistor of the low-side switch to the ground plate 513. This connection couples the source of the E-mode transistor to the ground terminal 593 as well as the conductive substrate of the low-side D-mode III-N transistor 1783. The gate driver 1722 includes a fourth terminal 1725 which connects the drain of the integrated E-mode transistor of the low-side switch to the source electrode 634' of the low-side D-mode III-N transistor 1783. Integrating the E-mode transistor of the high-side and low-side switch into the gate driver 1720 can reduce complexity of module 1700 compared to module 1600 and reduce overall assembly cost. Although not shown, gate driver 1720 can alternatively be two discrete gate drivers, such that the first gate driver is connected to the high-side switch and the second gate driver is connected to the low-side switch.

A number of implementations have been described. Nevertheless, it will be understood that various modifications may be made without departing from the spirit and scope of the techniques and devices described herein. Accordingly, other implementations are within the scope of the following claims.

What is claimed is:

1. An electronic module, comprising:
   a package and a conductive lead frame; the conductive lead frame comprising a first portion configured to be connected to a high voltage node, a second portion configured to be connected to an output node and a third portion configured to be connected to a ground node, wherein each of the first portion, second portion and third portion is electrically isolated from one another;
   a high-side switch comprising a first enhancement-mode transistor and a III-N depletion-mode transistor in a cascode configuration, wherein the III-N depletion-mode transistor comprises a III-N material structure on an electrically conductive substrate; and
   a low-side switch;
   wherein a drain electrode of the III-N depletion-mode transistor is electrically connected to the first portion of the lead frame, a source electrode of the enhancement-mode transistor is electrically connected to the second portion of the lead frame, a gate electrode of the depletion-mode transistor is electrically connected to the electrically conductive substrate of the depletion-mode transistor, and the substrate of the depletion-mode transistor is electrically connected to the second portion of the lead frame.

2. The electronic module of claim 1, wherein the low-side switch comprises a second enhancement-mode transistor and a second III-N depletion-mode transistor, the second III-N depletion mode transistor comprising a second III-N material structure over a second electrically conductive substrate;
   wherein a drain electrode of the second depletion-mode transistor is electrically connected to the second portion of the lead frame, a source electrode of the second enhancement-mode transistor is connected to the third portion of the lead frame, a gate electrode of the second III-N depletion-mode transistor is electrically connected to a second electrically conductive substrate, and the second substrate is electrically connected to the third portion of the lead frame.

3. The electronic module of claim 2, wherein the high-side switch and the low-side switch form a half bridge circuit.

4. The electronic module of claim 3, wherein the depletion-mode transistor is configured to be able to block at least 600V while the high-side switch is biased off and conduct current greater than 30 A while the high-side switch is biased on.

5. The electronic module of claim 3, further comprising a capacitor, wherein a first terminal of the capacitor is electrically connected to the first portion of the lead frame and a second terminal of the capacitor is electrically connected to the third portion of the lead frame.

6. The electronic module of claim 1, further comprising a second high-side switch and a second low-side switch, wherein the high side switch and second high side switch are electrically connected in parallel, and the low side switch and second low-side switch are electrically connected in parallel.

7. The electronic module of claim 5, wherein the capacitor is a hybrid capacitor comprising a resistive and a capacitive component in series.

8. The electronic module of claim 1, wherein:
   the gate, source, and drain electrodes of the III-N depletion-mode transistor are on an opposite side of the III-N material structure from the electrically conductive substrate; and
   the III-N material structure comprises a via-hole formed therein, and
   a metal layer forming the gate electrode is electrically connected to the electrically conductive substrate though the via-hole.

9. The electronic module of claim 2, further comprising a gate driver encased within the package, wherein a first terminal of the gate driver is connected to a gate electrode of the first enhancement-mode transistor and a second terminal of the gate driver is connected to a gate electrode of the second enhancement-mode transistor.

10. The electronic module of claim 9, wherein the first or second enhancement-mode transistors are integrated internally within the gate driver.

11. A half bridge circuit, comprising;
a high-side switch and a low-side switch each encased in a single electronic package, the package comprising a high-voltage terminal, an output terminal and a ground terminal; and
the high-side switch comprising a first enhancement-mode transistor and a first depletion-mode III-N transistor arranged in a cascode configuration; and
the low-side switch comprising a second enhancement-mode transistor and a second depletion-mode III-N transistor arranged in a cascode configuration;
wherein a first drain electrode of the first depletion-mode III-N transistor is electrically connected to the high-voltage terminal, a first gate electrode of the first depletion-mode III-N transistor is electrically connected to the output terminal, a second drain electrode of the second depletion-mode III-N transistor is electrically connected to the output terminal, and a second gate electrode of the second depletion-mode III-N transistor is electrically connected to the ground terminal.

12. The circuit of claim 11, wherein the first gate electrode of the first depletion-mode III-N transistor is electrically connected to a substrate of the first depletion-mode III-N transistor, and a substrate of the first depletion-mode III-N transistor is electrically connected to the output terminal.

13. The circuit of claim 12, wherein the second gate electrode of the second depletion-mode III-N transistor is electrically connected to the substrate of the second depletion-mode III-N transistor, and the substrate of the second depletion-mode III-N transistor is electrically connected to the ground terminal.

14. The circuit of claim 13, further comprising a capacitor with a first terminal and a second terminal, wherein the first terminal of the capacitor is connected to the high-voltage terminal and the second terminal is connected to the ground terminal.

15. The circuit of claim 14, further comprising a gate driver encased within the package, wherein a first terminal of the gate driver is connected to a gate electrode of the first enhancement-mode transistor and a second terminal of the gate driver is connected to a gate electrode of the second enhancement-mode transistor.

16. The circuit of claim 15, wherein the first and second enhancement-mode transistors are integrated within the gate driver.

17. The circuit of claim 14, further comprising a second high-side switch and a second low-side switch, wherein the high side switch and second high side switch are electrically connected in parallel, and the low-side switch and second low-side switch are electrically connected in parallel.

18. The circuit of claim 11, wherein the circuit comprises n number of high side switches connected in parallel and n of low side switches connected in parallel.

19. An electronic module, comprising:
a first, second, and third high-side switch;
a first, second, and third low-side switch; and
a single common electronic package encasing each switch of the first, second, and third high-side switch and first, second, and third low-side switch, wherein the electronic package comprises a first metal layer electrically connected to a high-voltage terminal, and a second metal layer electrically connected to a ground terminal;
wherein the first, second, and third low-side switch each comprises an enhancement-mode transistor and a depletion-mode III-N transistor arranged in a cascode configuration, each respective depletion-mode III-N transistor comprises a respective III-N material structure formed over a respective electrically conductive substrate, each conductive substrate of the first, second, and third low-side switch is electrically connected to the second metal layer of the electronic package, and each respective gate electrode of the depletion-mode III-N transistor of the first, second, and third low side switch is electrically connected to its respective electrically conductive substrate; and
wherein the first, second, and third high-side switch and the first, second, and third low-side switch form a 3-phase bridge circuit.

20. The electronic module of claim 19, the package further comprising a third, fourth, and fifth metal layer, wherein a substrate of the first high-side switch is connected to the third metal layer, a substrate of the second high-side switch is connected to the fourth metal layer, and a substrate of the third high-side switch is connected to the fifth metal layer, and wherein the first, second, third, fourth, and fifth metal layers are all electrically isolated from one another.

21. The electronic module of claim 20, further comprising a first output terminal, a second output terminal, and a third output terminal, wherein the first output terminal is electrically connected to the third metal layer, the second output terminal is electrically connected to the fourth metal layer, and the third output terminal is electrically connected to the fifth metal layer.

22. The electronic module of claim 21, wherein, in the first low-side switch, the gate electrode of the III-N depletion-mode transistor is on an opposite side of the III-N material structure from the electrically conductive substrate, and the III-N material structure comprises a via-hole formed therein, and a metal layer forming the gate electrode is electrically connected to the electrically conductive substrate though the via-hole.

23. The electronic module of claim 19, further comprising a capacitor, wherein a first terminal of the capacitor is electrically connected to the first metal layer and a second terminal of the capacitor is electrically connected to the second metal layer.

* * * * *